(12) United States Patent
Akamatsu

(10) Patent No.: US 11,531,276 B2
(45) Date of Patent: Dec. 20, 2022

(54) EXPOSURE APPARATUS, EXPOSURE METHOD, AND ARTICLE MANUFACTURING METHOD

(71) Applicant: CANON KABUSHIKI KAISHA, Tokyo (JP)

(72) Inventor: Akio Akamatsu, Tochigi (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 17/506,262

(22) Filed: Oct. 20, 2021

(65) Prior Publication Data

US 2022/0137522 A1 May 5, 2022

(30) Foreign Application Priority Data

Nov. 5, 2020 (JP) .............................. JP2020-185158

(51) Int. Cl.
*G03F 7/20* (2006.01)
(52) U.S. Cl.
CPC ................................. *G03F 7/70641* (2013.01)
(58) Field of Classification Search
CPC .................................................. G03F 7/70641
See application file for complete search history.

(56) References Cited

U.S. PATENT DOCUMENTS

| 7,148,973 B2* | 12/2006 | Sentoku | G03F 7/70233 |
| | | | 250/548 |
| 9,910,371 B2* | 3/2018 | Kawanami | G03F 7/70516 |
| 2004/0218158 A1* | 11/2004 | Nishi | G03F 9/7026 |
| | | | 355/53 |

FOREIGN PATENT DOCUMENTS

JP H04348019 A 12/1992

* cited by examiner

*Primary Examiner* — Hung V Nguyen
(74) *Attorney, Agent, or Firm* — Canon U.S.A., Inc. IP Division

(57) ABSTRACT

The control unit controls the relative position in an optical axis direction of the projection system and the relative position in a direction perpendicular to an optical axis direction at a third timing after a second timing based on a first distribution of illumination light detected by the detection system at a first timing and a second distribution of illumination light detected by the detection system at the second timing after the first timing, the illumination light detected at the first and second timings having passed through the first and second marks.

20 Claims, 15 Drawing Sheets

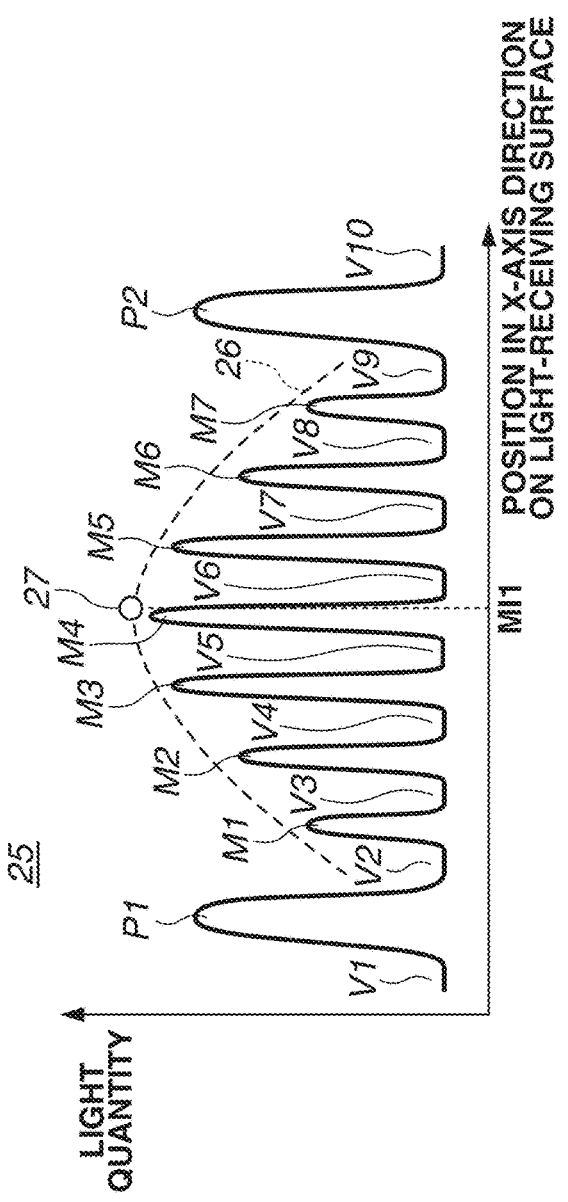
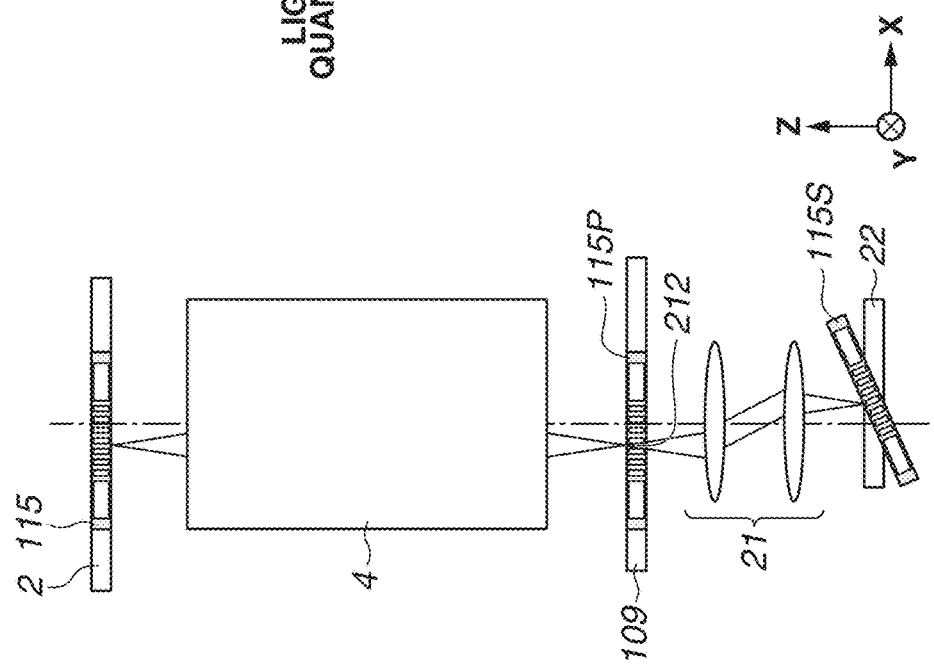

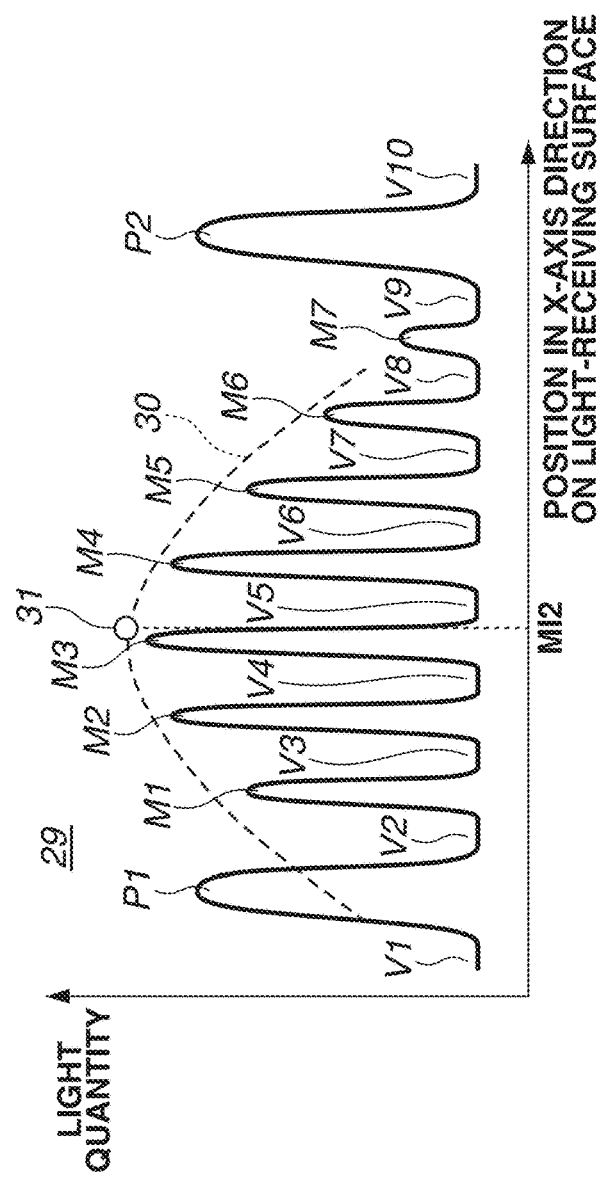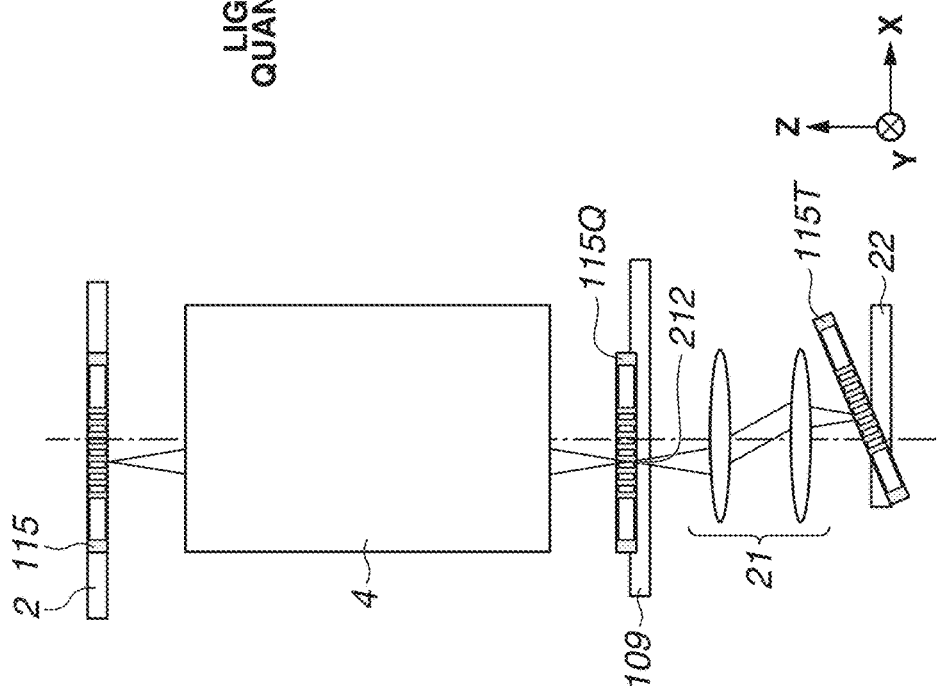

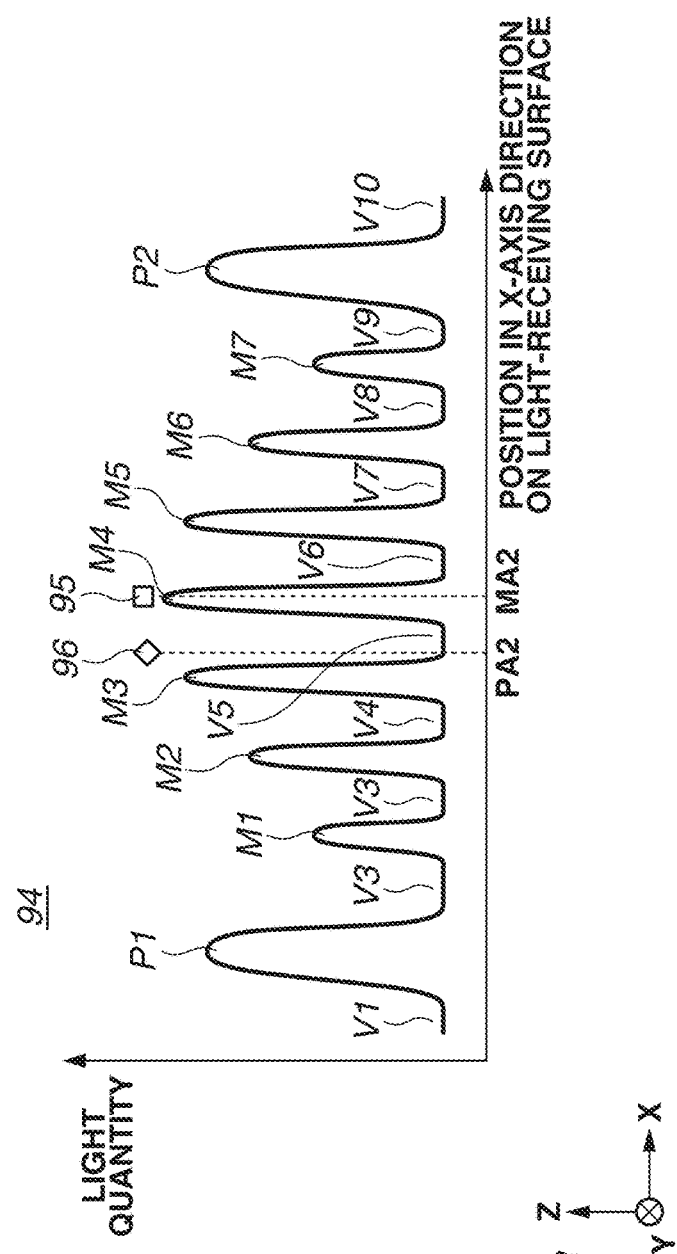
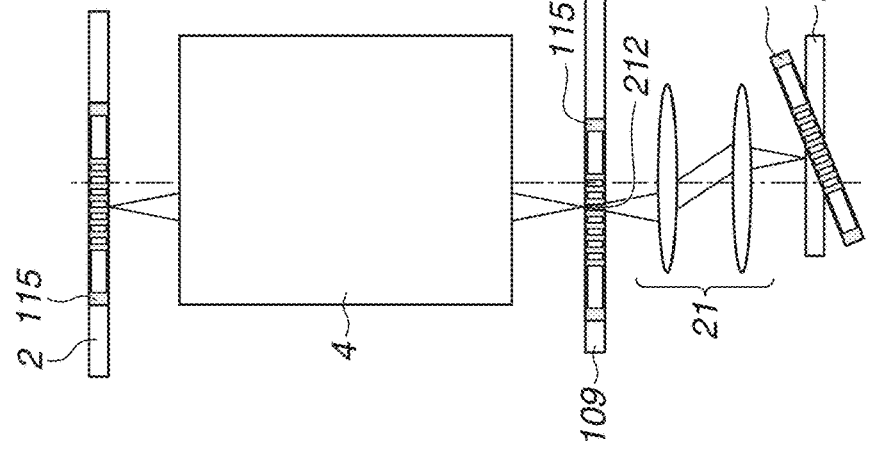

EXPOSURE APPARATUS, EXPOSURE METHOD, AND ARTICLE MANUFACTURING METHOD

BACKGROUND OF THE DISCLOSURE

Field of the Disclosure

The aspect of the embodiments relates to an exposure apparatus, an exposure method, and an article manufacturing method.

Description of the Related Art

In a photolithography process of manufacturing a device, such as a semiconductor device or a flat panel display (FPD), an exposure apparatus that transfers a pattern of a mask onto a substrate is used. In such an exposure apparatus, it is demanded to accurately adjust an alignment (relative position alignment between a mask and a substrate in a direction perpendicular to an optical axis of a projection optical system) and focus (focus of light irradiated on the substrate) so as to accurately transfer a pattern of the mask onto the substrate.

A calibration using a through-the-lens (TTL) method using a projection optical system is proposed as one of alignment and focus adjustment methods. Japanese Patent Application Laid-Open No. 4-348019 discusses a technique of a focus calibration using the TTL method. Generally, in the focus calibration, the light quantity obtained through the projection optical system, a mark on a stage, and the like is detected while a substrate stage is being driven in an optical axis direction of the projection optical system. The position of a substrate at which an optimum focus can be obtained on the surface (resist layer) is determined based on a change in the light quantity when the substrate stage is driven in the optical axis direction of the projection optical system.

An optimum relative position (best focus position) of a mask and a substrate is known to change with elapsed time due to air fluctuations inside the projection optical system and a positional deviation of a member of the projection optical system under the influence of heat or the like during exposure processing. If the exposure processing is executed in a state where the best focus position has deviated, the exposure accuracy may decrease. Accordingly, even in a case where the focus calibration is performed once with the best focus position changed, the focus calibration is performed again. However, since it takes time to perform the focus calibration, the productivity for processing the substrate decreases.

SUMMARY OF THE DISCLOSURE

According to an aspect of the embodiments, an exposure apparatus performs exposure processing of transferring a pattern of a mask onto a substrate, the exposure apparatus including a projection system configured to project the pattern of the mask onto the substrate, a detection system configured to detect a light quantity distribution of illumination light having passed through a first mark disposed on an object surface of the projection system, the projection system, and a second mark disposed on an image plane of the projection system, and a control unit configured to control a relative position of the mask and the substrate. The control unit controls the relative position in an optical axis direction of the projection system and the relative position in a direction perpendicular to an optical axis direction at a third timing after a second timing based on a first distribution of illumination light detected by the detection system at a first timing and a second distribution of illumination light detected by the detection system at the second timing after the first timing, the illumination light detected at the first timing having passed through the first mark and the second mark, the illumination light detected at the third timing having passed through the first mark and the second mark.

Further features of the disclosure will become apparent from the following description of exemplary embodiments with reference to the attached drawings.

BRIEF DESCRIPTION OF THE DRAWINGS

FIG. 4A is an explanatory diagram illustrating a state of the exposure apparatus at a reference focus position, and FIG. 4B is a graph illustrating a light quantity distribution of illumination light.

FIG. 5A is an explanatory diagram illustrating a state of the exposure apparatus at a position deviating from the reference focus position, and FIG. 5B illustrates a light quantity distribution of illumination light.

FIG. 11A is an explanatory diagram illustrating a state of the exposure apparatus at a position deviating from the reference alignment position, and FIG. 11B illustrates a light quantity distribution of illumination light.

DESCRIPTION OF THE EMBODIMENTS

Figure 1A:
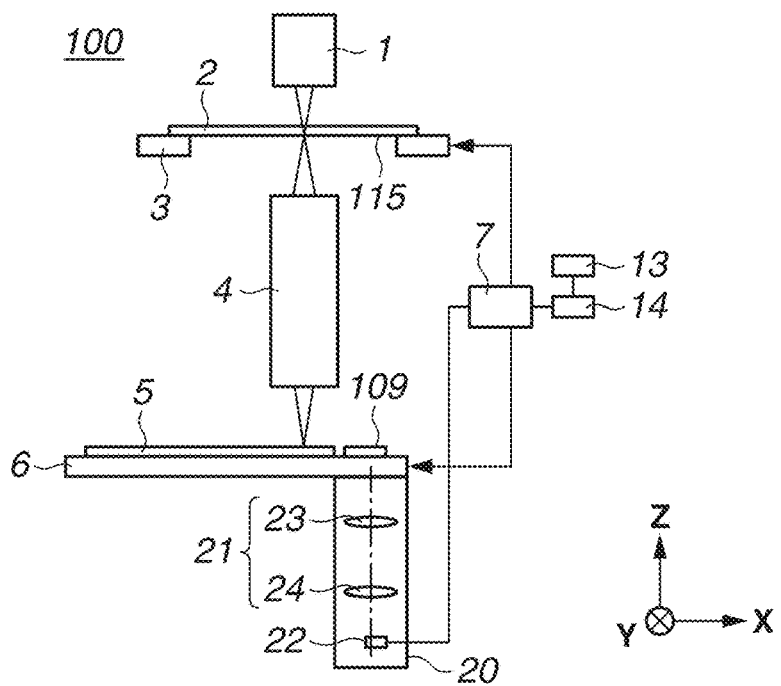
FIGS. 1A to 1D are schematic diagrams each illustrating a configuration of an exposure apparatus according to a first exemplary embodiment.

Exemplary embodiments of the disclosure will be described in detail below with reference to the accompanying drawings. In the drawings, the same members are denoted by the same reference numerals, and a duplicate description thereof is omitted.

(Configuration of Exposure Apparatus)

A first exemplary embodiment of the disclosure will be described below. A configuration of an exposure apparatus according to the present exemplary embodiment will be described. The exposure apparatus according to the present exemplary embodiment is a lithography apparatus used in a photolithography process of manufacturing a device such as a semiconductor device or a flat panel display (FPD). The exposure apparatus according to the present exemplary embodiment employs a step-and-scan method to perform exposure processing of exposing a substrate to light through a mask having a surface on which a pattern is formed and transferring the pattern of the mask onto the substrate. While the step-and-scan method is used as an exposure method in the present exemplary embodiment, the exposure method is not limited to the step-and-scan method. The exposure processing may be performed by any other exposure method, such as a step-and-repeat method.

FIGS. 1A to 1D each illustrate a configuration of an exposure apparatus 100 according to the present exemplary embodiment. FIG. 1A is a schematic diagram illustrating the entire configuration of the entire exposure apparatus 100. In the present exemplary embodiment, a coordinate system is defined assuming that a direction parallel to an optical axis of a projection optical system is set as a Z-axis direction and any plane perpendicular to the Z-axis direction is set as an XY plane.

The exposure apparatus 100 includes an optical illumination system 1 that illuminates a mask 2, a mask stage 3 that holds the mask 2, a projection optical system 4 that projects a pattern of the mask 2 on a substrate 5, and a substrate stage 6 that holds the substrate 5. The exposure apparatus 100 also includes a control unit 7 that controls each unit of the exposure apparatus 100, an input unit 13, and a determination unit 14.

The exposure apparatus 100 further includes means for illuminating a first measurement mark with illumination light using the optical illumination system 1, and a detection optical system 20 that detects a light quantity distribution of illumination light that has passed through the projection optical system 4 and a mark portion including a first measurement mark 115 and a second measurement mark 109 that are illuminated. The detection optical system 20 includes an image-forming system 21 and a detection unit 22. The image-forming system 21 includes a system including a lens 23 and a lens 24. The wavelength of illumination light is the same as the wavelength of exposure light for projecting the pattern of the mask 2 on the substrate 5.

The control unit 7 includes a computer including a central processing unit (CPU) and a memory, and controls each unit of the exposure apparatus 100 in an integrated manner to operate the exposure apparatus 100. For example, in the case of performing exposure processing, the control unit 7 controls a relative position of the mask 2 and the substrate 5 in an optical axis direction (Z-axis direction) of the projection optical system 4 and a relative position of the mask 2 and the substrate 5 in directions perpendicular to the optical axis of the projection optical system 4 (an X-axis direction and a Y-axis direction that are orthogonal to each other).

Exposure conditions for exposure processing, that is, processing of transferring the pattern of the mask 2 onto the substrate 5 (examples of such conditions include an exposure area, an illumination mode, and the pattern of the mask 2), are input to the input unit 13 by a user operation. The determination unit 14 determines measurement conditions for calibration to be described below based on the exposure conditions input to the input unit 13 (examples of such conditions include the number of measurements and a storage time of the detection unit 22).

The detection optical system 20 is provided on the substrate stage 6, and is configured such that the illumination light that has passed through the second measurement mark 109 formed on an upper surface of the substrate stage 6 is incident on the detection unit 22. The detection optical system 20 illustrated in FIG. 1A is enlarged below the substrate stage 6 for convenience of illustration. However, in practice, the detection optical system 20 is formed inside the substrate stage 6. The detection unit 22 is, for example, an image sensor, such as a line sensor, in which a plurality of pixels is arranged in a predetermined direction. The detection unit 22 may detect light reflected by the first measurement mark 115 or the second measurement mark 109, instead of detecting light that has passed through the mark portion including the first measurement mark 115 and the second measurement mark 109.

The image-forming system 21 is an optical system that is disposed between the projection optical system 4 and the detection unit 22, and forms images of the first measurement mark 115 and the second measurement mark 109 on the detection unit 22. In the present exemplary embodiment, the image-forming system 21 is an optical system that has a predetermined image-forming magnification, forms images on the detection unit 22 by multiplying the first measurement mark 115 and the second measurement mark 109 by the predetermined image-forming magnification, and guides the illumination light. The above-described magnification can appropriately be set depending on the resolution of the detection unit 22. The detection unit 22 includes a plurality of pixels and detects (captures) images of the first measurement mark 115 and the second measurement mark 109 that are formed by the image-forming system 21. The image-forming system 21 is a system having an appropriate amount of aberration (field curvature) as described below. The image-forming system 21 may be configured to include three or more lenses and other optical elements.

The illumination light (exposure light) from the optical illumination system 1 passes through the mask 2 held on the mask stage 3 and reaches the substrate 5 held on the substrate stage 6 through the projection optical system 4. A pattern surface of the mask 2 and a surface (resist layer) of the substrate 5 are disposed with a conjugate positional relationship through the projection optical system 4. Thus, the pattern of the mask 2 is transferred onto the substrate 5 through the projection optical system 4. Since the step-and-scan method is employed in the present exemplary embodiment, the exposure processing is performed while the mask stage 3 and the substrate stage 6 are synchronously scanned in the Y-axis direction.

Figure 1B:
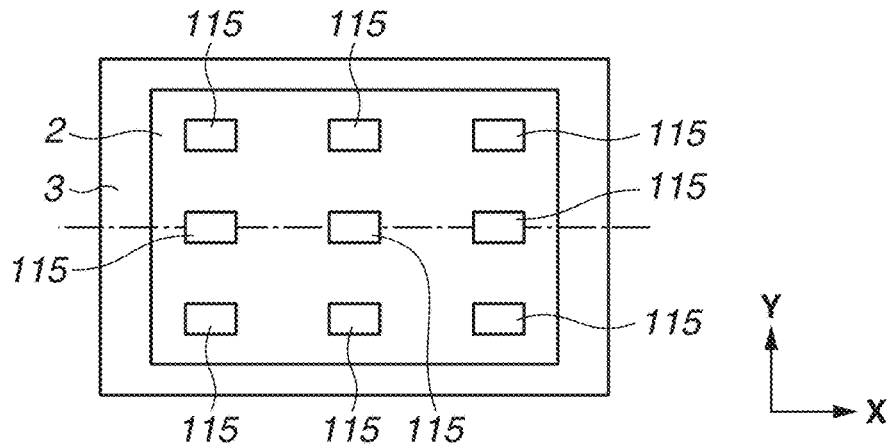

FIG. 1B is a plan view illustrating a configuration example of the mask stage 3. On the mask 2 held on the mask stage 3, the first measurement mark 115 can be formed separately from the pattern to be transferred onto the substrate 5. A plurality of first measurement marks 115 is provided at intervals in the X-axis direction and Y-axis direction of the mask 2. A single first measurement mark 115 may be provided on the mask 2. However, in one embodiment, a plurality of first measurement marks 115 is provided to measure the characteristics of the projection optical system 4 in detail. Examples of the characteristics of the projection optical system 4 include a focal point position and distortion.

Figure 1C:
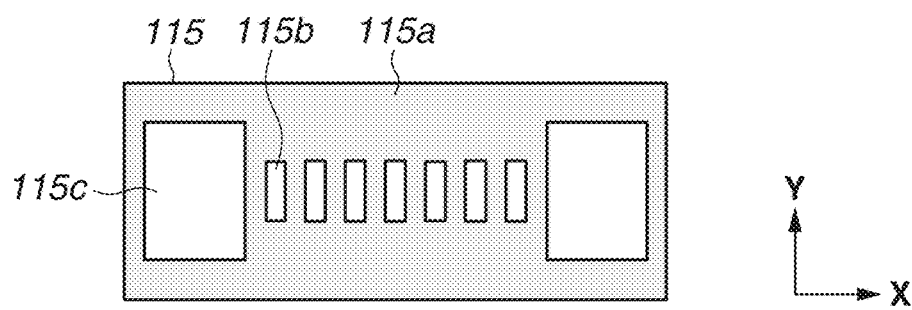

FIG. 1C illustrates details of the first measurement mark 115. FIG. 1C is a plan view illustrating the first measurement mark 115. The first measurement mark 115 includes a light-shielded area 115a, transmissive areas 115b including a plurality of patterns with a predetermined line width and pitch, and transmissive areas 115c. The transmissive areas 115b are arranged along the X-axis direction and form a line-and-space pattern. While the present exemplary embodiment assumes a case where the first measurement mark 115 is formed on the mask 2, the disclosure is not limited to this case. The first measurement mark 115 may be provided at a position corresponding to an object surface of the projection optical system 4. For example, the first measurement mark 115 may be formed on the mask stage 3. In this case, a calibration for the projection optical system 4 can be performed even in a case where the mask 2 is not placed on the mask stage 3.

Various patterns (or pattern groups) with different line widths, pitches, directions, and the like may be used as the line-and-space pattern of the transmissive areas 115b. The transmissive areas 115c are provided to illuminate transmissive areas 109c of the second measurement mark 109 to be described below. The present exemplary embodiment illustrates an example where the transmissive areas 115c are provided to illuminate the transmissive areas 109c. However, instead of providing the transmissive areas 115c, the transmissive areas 109c may be irradiated with light by applying illumination light to the outside of the range of the light-shielded area 115a.

Figure 1D:
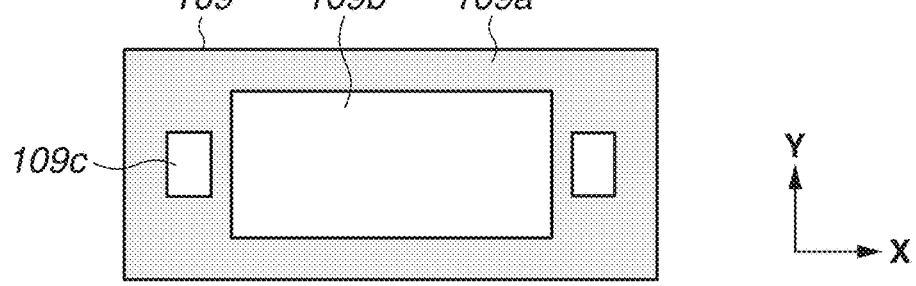

Next, FIG. 1D illustrates details of the second measurement mark 109. FIG. 1D is a plan view illustrating the second measurement mark 109. The second measurement mark 109 includes a light-shielded area 109a, a transmissive area 109b, and the transmissive areas 109c. While the present exemplary embodiment assumes a case where the second measurement mark 109 is formed on the substrate stage 6, the disclosure is not limited to this case. The second measurement mark 109 may be formed at a location other than the substrate stage 6, as long as the second measurement mark 109 can be set at a position corresponding to an image plane of the projection optical system 4. The transmissive area 109b is provided to transmit the irradiated light that has passed through the transmissive areas 115b of the first measurement mark 115.

Figure 2:
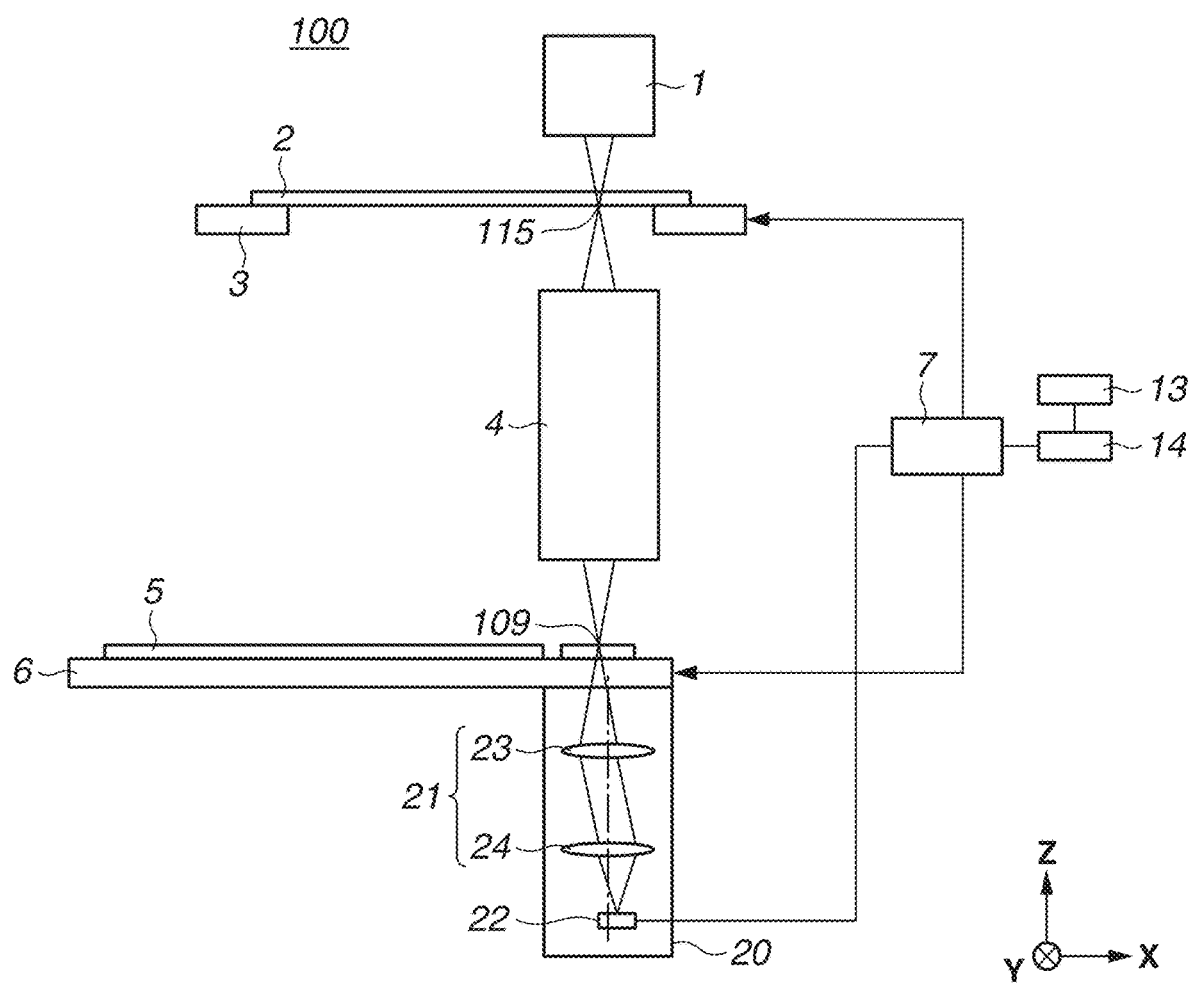
FIG. 2 is a schematic diagram illustrating the exposure apparatus during measurement processing.

FIG. 2 is a schematic diagram illustrating the exposure apparatus 100 in a state where the first measurement mark 115 and the second measurement mark 109 is set at a measurement position, i.e., during measurement processing of alignment and focus adjustment. The term "alignment" refers to a relative position alignment between the mask 2 and the substrate 5 in a direction perpendicular to the optical axis of the projection optical system 4. The term "focus" refers to a focus of light irradiated on the substrate 5 (focus in the projection optical system 4). A measurement for alignment and a correction based on the measurement are hereinafter referred to as "alignment calibration", and a measurement for focus adjustment and a correction based on the measurement are hereinafter referred to as "focus calibration".

According to the present exemplary embodiment, in alignment and focus calibration operations, measurement processing is performed without further moving the mask stage 3 and the substrate stage 6 that have been set at the measurement position in the Z-axis direction. During the measurement processing, the control unit 7 drives the mask stage 3 so that the mask stage 3 is located at the measurement position of the first measurement mark 115, which is determined by the determination unit 14. Similarly, in the case of executing the above-described calibration operations, the control unit 7 drives the substrate stage 6 so that the substrate stage 6 is set at the measurement position of the second measurement mark 109, which is determined by the determination unit 14.

(Aberration in Image-Forming System 21)

Figure 3:
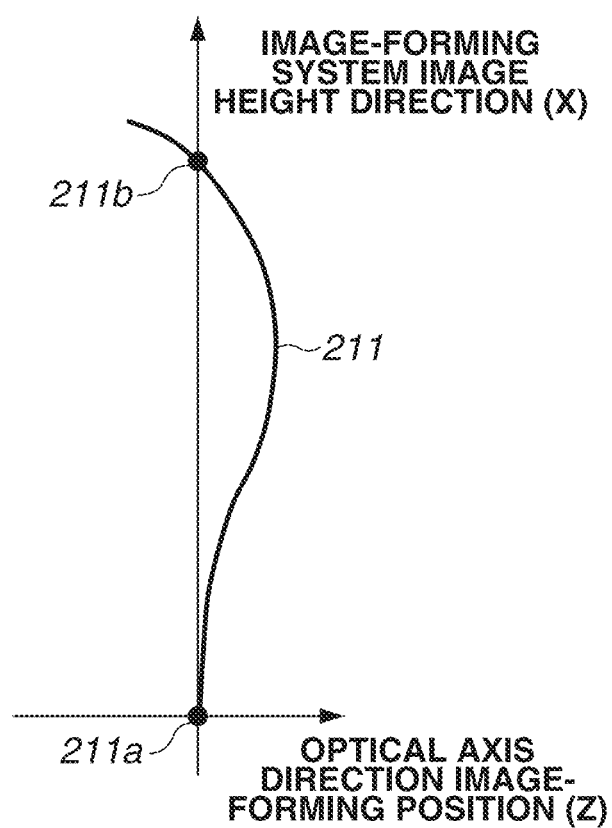
FIG. 3 is a longitudinal aberration diagram of a field curvature.

A relationship between an aberration and an image-forming position in the detection optical system 20 according to the present exemplary embodiment will be described with reference to FIG. 3. An example where the detection optical system 20 has a predetermined field curvature as an optical characteristic will be described below. FIG. 3 is a longitudinal aberration diagram of the field curvature in the image-forming system 21. The vertical axis in the graph represents the image height (X-coordinate) of the image-forming system 21, and the horizontal axis in the graph represents the image-forming position (Z-coordinate) in the optical axis direction. A curve 211 is a curve indicating the field curvature in the detection optical system 20 (i.e., a curve indicating the image-forming position at each image height).

The curve 211 is characterized in that the image-forming position in the optical axis direction greatly changes even with only a slight change in the image height in the vicinity of a point 211b, unlike in the vicinity of a point 211a. For example, in a case where the optical axis of the image-forming system 21 is disposed to be perpendicular to the light-receiving surface of the detection unit 22 in the vicinity of the point 211b, the pattern on the object surface of the image-forming system 21 is not focused on the entire light-receiving surface of the detection unit 22, but is only partially focused on the light-receiving surface. In the present exemplary embodiment, the point 211a corresponds to the position of the optical axis of the image-forming system 21 of the detection optical system 20, and the point 212b corresponds to a measurement image height at which first measurement mark 115 and the second measurement mark 109 are measured.

In the present exemplary embodiment, for example, the image-forming system 21 is configured to generate the field curvature illustrated in FIG. 3, and the center of the light-receiving surface of the detection unit 22 is disposed at a position deviating from the optical axis of the image-forming system 21, as described above. The first measurement mark 115 is then illuminated with illumination light from the optical illumination system 1, and the light that has passed through the transmissive areas 115b of the first measurement mark 115 is detected by the detection unit 22 through the projection optical system 4 and the transmissive area 109b of the second measurement mark 109, thus performing a focus measurement. This configuration enables the focus calibration to be performed by a method to be described below, without moving the mask stage 3 and the substrate stage 6 that have been set at the measurement position.

In the present exemplary embodiment, the first measurement mark 115 is illuminated with light from the optical illumination system 1, and the light that has passed through the transmissive areas 115c of the first measurement mark 115 is detected by the detection unit 22 through the projection optical system 4 and the transmissive areas 109c of the second measurement mark 109. Thus, the alignment calibration operation can be performed at the same time as the focus calibration operation by a method to be described below.

(Focus Calibration)

Next, amount-of-change measurement processing of measuring the amount of change in focus according to the present exemplary embodiment will be described with reference to FIGS. 4A and 4B and FIGS. 5A and 5B. FIG. 4A and FIG. 5A are explanatory diagrams each illustrating a state of the exposure apparatus 100 in the processing of measuring the amount of change in focus, and illustrating a mark image projected on the detection unit 22 after the image of the first measurement mark 115 has passed through the projection optical system 4, the second measurement mark 109, and the image-forming system 21. FIG. 4A illustrates a state at a first timing (a state where a focus position set by the projection optical system 4 corresponds to a reference focus position). FIG. 5A illustrates a state at a second timing after the exposure processing performed after the first timing (a state where the focus position set by the projection optical system 4 has deviated from the reference focus position).

The projection optical system 4 is directed to projecting the pattern image of the mask 2 while focusing the pattern image on the surface of the substrate 5. Thus, an image of the first measurement mark 115 is to be formed on a plane where the surface of the substrate 5 is to be located and the projection optical system 4 for projecting the image is in an in-focus state.

Assume herein that in the state illustrated in FIG. 4A (i.e., at the first timing), the image of the first measurement mark 115 formed on the plane where the surface of the substrate 5 is to be located is referred to as an image-forming pattern 115P. A pattern image obtained when the image-forming pattern 115P passes through the image-forming system 21 and an image of the image-forming pattern 115P is formed on the detection unit 22 is referred to as an image-forming pattern 115S.

In this case, due to the field curvature of the image-forming system 21, the image of the image-forming pattern 115S is formed on a plane that is perpendicular to the optical axis of the image-forming system 21 and is inclined with respect to the light-receiving surface of the detection unit 22. Thus, in the present exemplary embodiment, an image-forming plane (image-forming pattern 115S) of the first measurement mark 115 provided by the image-forming system 21 only partially overlaps the light-receiving surface of the detection unit 22. The image-forming plane of the second measurement mark 109 provided by the image-forming system 21 partially overlaps the light-receiving surface of the detection unit 22 as well.

FIG. 4B is a graph illustrating a light quantity distribution (first light quantity distribution) of illumination light that has passed through the first measurement mark 115 and the second measurement mark 109 and is detected by the detection unit 22 at the first timing. The vertical axis in the graph represents the light quantity obtained on the light-receiving surface of the detection unit 22, and the horizontal axis in the graph represents the position on the light-receiving surface of the detection unit 22 in the X-axis direction. The first light quantity distribution includes distributions M1 to M7 corresponding to the transmissive areas 115b of the first measurement mark 115 and distributions P1 and P2 corresponding to the transmissive area 109b of the second measurement mark 109. The first light quantity distribution also includes distributions V1 to V10 corresponding to the light-shielded area 115a of the first measurement mark 115 and the distributions V1, V2, V9, and V10 corresponding to the light-shielded area 109a of the second measurement mark 109.

Here, since the image-forming system 21 according to the present exemplary embodiment has a field curvature, a deviation occurs between the image plane of the detection optical system 20 and the light-receiving surface of the detection unit 22. In the light quantity distribution, the light quantity increases in a portion where the deviation does not occur or is minimum, and the light quantity decreases depending on the amount of deviation in another portion where the deviation is larger than that in the portion. As seen from the light quantity distribution illustrated in FIG. 4B, the light quantity in the distribution M4 is the largest among the distributions M1 to M7. This indicates that the focus is obtained at the position on the light-receiving surface of the detection unit 22 corresponding to the distribution M4. The light quantity in each of the distributions P1 and P2 is large although the focus is not obtained thereon. This is because the transmissive areas 109c of the second measurement mark 109 are wide and the sensitivity to a change in the light quantity for the defocus state is low.

A method of determining the position at which focus is obtained (hereinafter, such a position is also referred to as an in-focus position) on the light-receiving surface of the detection unit 22 based on the light quantity distribution illustrated in FIG. 4B will be described. In this determination method, only the distributions M1 to M7 corresponding to the transmissive areas 115b of the first measurement mark 115 are focused. Initially, the distributions M1, M2, and M3 indicate that the image-forming position has deviated in the −Z-direction (or +Z-direction) with respect to the detection unit 22. The distributions M5, M6, and M7 indicate that the image-forming position has deviated in the +Z-direction (or −Z-direction) with respect to the detection unit 22. Thus, if the position, on the light-receiving surface of the detection unit 22, corresponding to the distribution M4 can be obtained, an in-focus position A on the light-receiving surface of the detection unit 22 can be determined by using the following Expression (1).

$$A = P \times \text{PixelSize} \times \tan\theta / \text{Mag} \quad (1)$$

In Expression (1), P denotes the position at which the largest light quantity is exhibited on the light-receiving surface of the detection unit 22, PixelSize denotes the size of each pixel of the detection unit 22, θ denotes an angle formed between the image-forming plane of the image-forming system 21 having a field curvature and the light-receiving surface of the detection unit 22, and Mag represents the magnification of the image-forming system 21.

The method of obtaining the in-focus position on the light-receiving surface of the detection unit 22 is not limited to the method of obtaining the position on the light-receiving surface by using Expression (1). For example, an envelope 26 including the distribution M4 with the largest light quantity and the other distributions M1 to M3 and M5 to M7 is obtained so that the position on the light-receiving surface can be accurately obtained based on the envelope 26. In such a case, even if the in-focus position on the light-receiving surface of the detection unit 22 is located in the vicinity of the distribution M4 (e.g., an intermediate position between the distribution M4 and the distribution M3), the in-focus position on the light-receiving surface of the detection unit 22 can be obtained based on the envelope 26. In FIG. 4B, such a position on the light-receiving surface of the detection unit 22 corresponding to a local maximum value 27 (peak position) of the envelope 26 obtained from the distributions M1 to M7 is denoted by a position MI1.

FIG. 5A illustrates a state where the position of the substrate stage 6 has deviated in the Z-direction from the state illustrated in FIG. 4A (state at the second timing after the first timing). As illustrated in FIG. 5A, the image of the first measurement mark 115 may deviate from 115P to 115Q in the Z-axis direction due to air fluctuations inside the projection optical system 4, a positional deviation of a member of the projection optical system 4, or the like under the influence of heat or the like during the exposure processing. In such a case, the image of the first measurement mark 115 deviates from 115S to 115T in the Z-axis direction also in the vicinity of the detection unit 22.

FIG. 5B is a graph illustrating a light quantity distribution (second light quantity distribution) of illumination light that has passed through the first measurement mark 115 and the second measurement mark 109 and is detected by the detection unit 22 at the second timing after the first timing. The vertical axis in the graph represents the light quantity obtained on the light-receiving surface of the detection unit 22, and the horizontal axis in the graph represents the position on the light-receiving surface of the detection unit 22 in the X-axis direction. In the second light quantity distribution, the light quantity in the distribution M3 is the largest among the distributions M1 to M7 and the position corresponding to the distribution M3 (or a position in the vicinity of the position) corresponds to the in focus position on the light-receiving surface of the detection unit 22. The position on the light-receiving surface of the detection unit 22 corresponding to a local maximum value 31 of an envelope 30 obtained from the distributions M1 to M7 is denoted by a position MI2. As in the position MI1 in the first light quantity distribution, the position MI2 in the second light quantity distribution may be an in-focus position.

The amount-of-change measurement processing of obtaining the amount of change in focus can be performed by obtaining the positions MI1 and MI2. Specifically, the in-focus position on the light-receiving surface of the detection unit 22 at the first timing is compared with the in-focus position on the light-receiving surface of the detection unit 22 at the second timing after the first timing (e.g., after a predetermined elapsed time or after exposure processing is performed on the substrate 5 a predetermined number of times). As a result, the amount of change in focus can be obtained.

Figure 6:
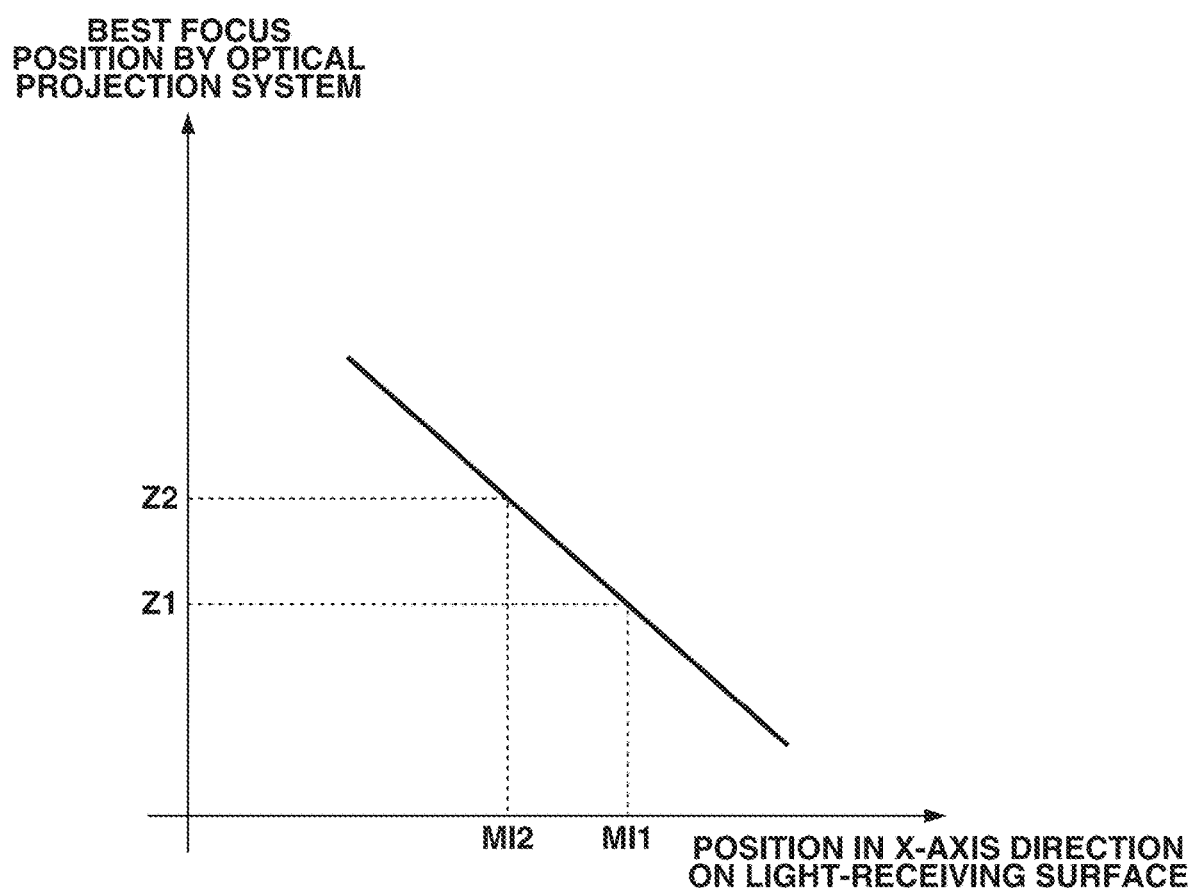
FIG. 6 is a graph illustrating a correspondence between a light quantity distribution and a focus position on a substrate stage.

FIG. 6 is a graph illustrating a relationship between the best focus position by the projection optical system 4 and the positions MI1 and MI2 each indicating a position in the X-axis direction on the light-receiving surface of the detection unit 22. As seen from FIG. 6, when the position corresponding to the local maximum value of the envelope changes from the position MI1 to the position MI2, the best focus position provided by the projection optical system 4 also changes from Z1 to Z2 according to the change in the position corresponding to the local maximum value of the envelope.

In a case where the effects of aberration and other disturbances are significant, a plurality of best focus positions to be provided by the projection optical system 4 and a plurality of measurement points for measuring the position on the light-receiving surface of the detection unit 22 corresponding to the local maximum value of the envelope may be prepared in advance. For example, a result of fitting of measurement points by an approximation may be stored as table data in the control unit 7. The control unit 7 can obtain the best focus position using table data indicating a correspondence relationship between the light quantity distribution detected by the detection unit 22 and the relative position of the mask 2 and the substrate 5 in the optical axis direction (Z-axis direction). Accordingly, the best focus positions at different timings can be obtained (examples of such best focus positions include Z1, Z2) and the amount of change in the best focus position can be obtained (examples of such an amount of change include Z1−Z2). The amount-of-change measurement processing of obtaining the amount of change in focus according to the present exemplary embodiment has been described above.

Two best focus position determination methods will now be described. In both the two methods, the best focus position is calculated based on a change in the light quantity of the first measurement mark 115 in the detection unit 22 when the substrate stage 6 is driven in the Z-axis direction. In the present exemplary embodiment, the best focus position determined at the first timing is set as the reference focus position, thus eliminating the need to drive the substrate stage 6 that has been set at the measurement position in the Z-axis direction in the second and subsequent calibrations. Consequently, decrease in productivity due to the calibration can be prevented.

Figure 7A:
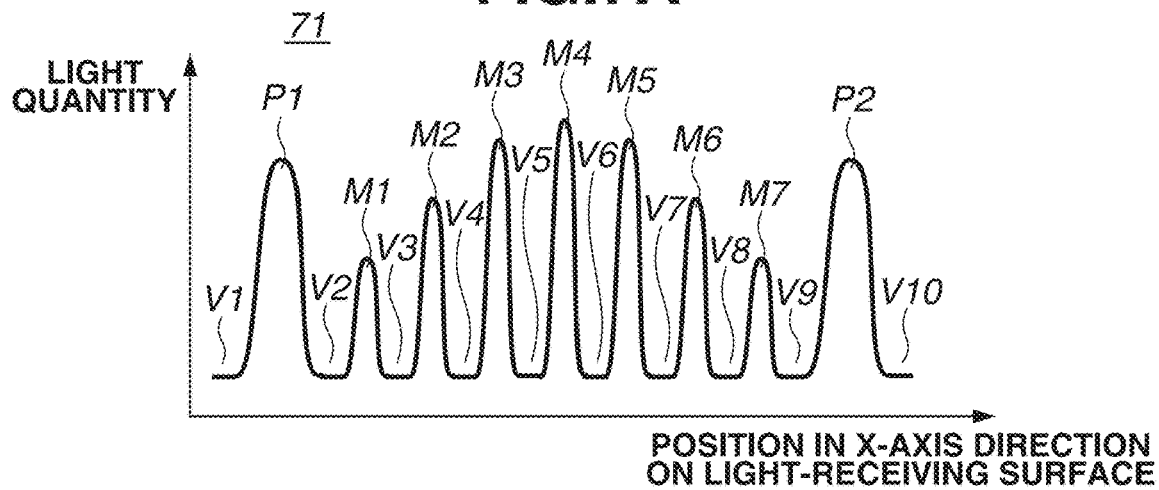
FIGS. 7A to 7C are graphs each illustrating a first method of calculating a best focus position.
Figure 7B:
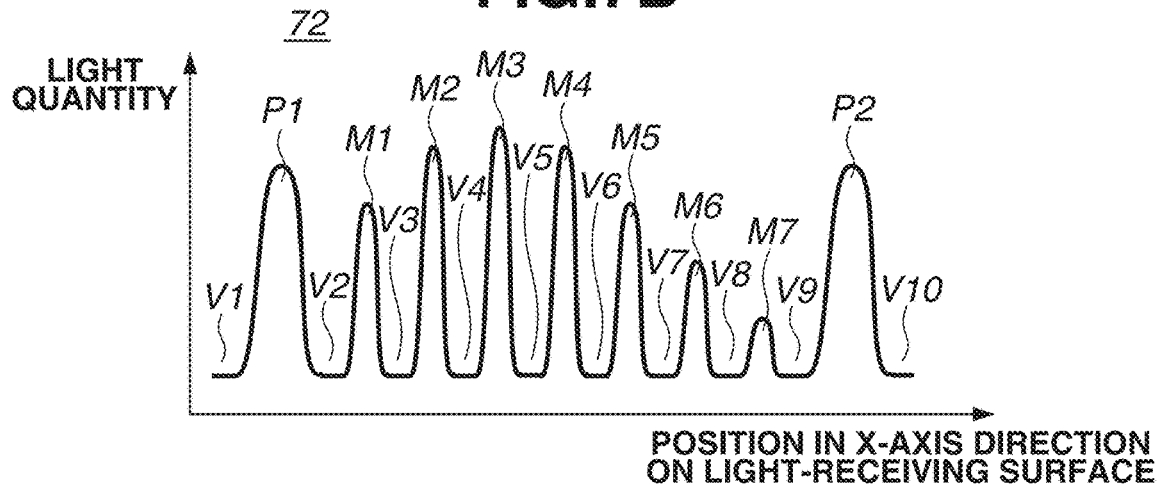
Figure 7C:
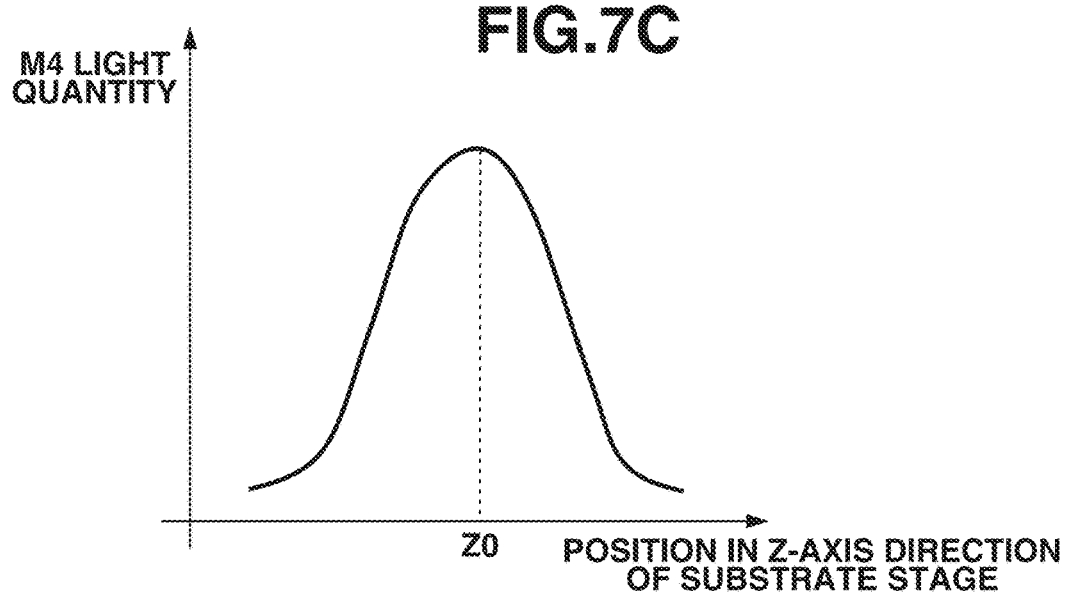

In the first method, a certain pattern is designated in the first measurement mark 115 and the position of the substrate stage 6 corresponding to the best focus position is determined based on the amount of change in the light quantity in the distribution (e.g., any one of the distributions M1 to M7 illustrated in FIGS. 7A and 7B) corresponding to the designated pattern. FIGS. 7A to 7C are graphs for explaining the first method of determining the best focus position. FIG. 7A illustrates a light quantity distribution in which the pattern of the first measurement mark 115 is detected by the detection unit 22 when the substrate stage 6 is positioned at a certain position in the Z-axis direction. FIG. 7B illustrates a light quantity distribution in which the pattern of the first measurement mark 115 is detected by the detection unit 22 when the substrate stage 6 is positioned at another position in the Z-axis direction that is different from the position in FIG. 7A. In this case, for example, when the pattern of the distribution M4 is paid attention to, the light quantity in the distribution M4 changes according to the position of the substrate stage 6 in the Z-axis direction.

FIG. 7C is a graph illustrating a change in the light quantity detected by the detection unit 22 when the distribution M4 is paid attention to. The vertical axis in the graph represents the light quantity in the distribution M4 illustrated in FIGS. 7A and 7B, and the horizontal axis in the graph represents the position in the Z-axis direction of the substrate stage 6. As illustrated in FIG. 7C, the light quantity changes corresponding to the position in the Z-axis direction of the substrate stage 6. Since the light quantity detected by the detection unit 22 is maximum at the best focus position of the substrate stage 6, the reference focus position can be determined by obtaining the position of the substrate stage 6 at which the light quantity becomes a local maximum value Z0 illustrated in FIG. 7C.

If distributions other than the distribution M4 are paid attention to, the reference focus position can be determined by taking into consideration the shift amount of the image plane in which the shift amount of the image plane at the image height corresponding to the distribution M4 is recognized in advance.

In the second method, the light quantity distribution of illumination light that has passed through the first measurement mark 115 at the image height at which the field curvature of the image-forming system 21 is minute, for example, in the vicinity of the point 211a in the longitudinal aberration diagram of FIG. 3 is obtained, and the best focus position is determined based on the amount of change in the light quantity of the illumination light. A minute field curvature indicates that the aberration (defocus amount) is less than or equal to ¼ of a focus calculation accuracy (e.g., 36) and is at a level at which the measurement is not affected.

Figure 8A:
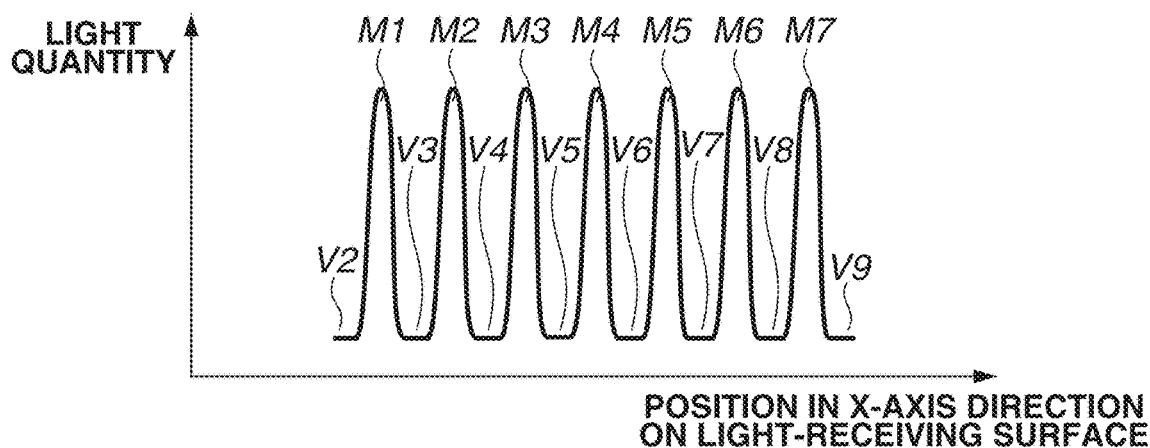
FIGS. 8A to 8C are graphs each illustrating a second method of calculating the best focus position.
Figure 8B:
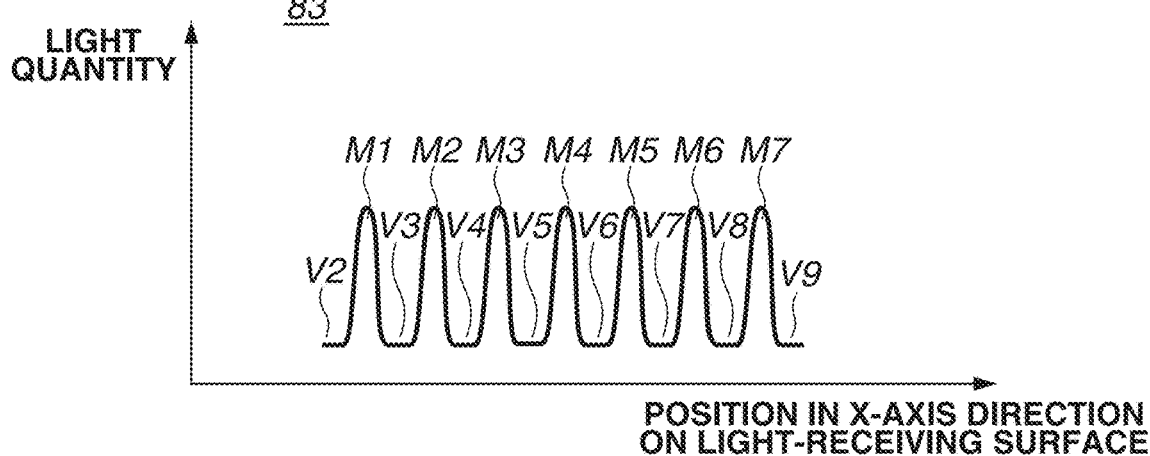
Figure 8C:
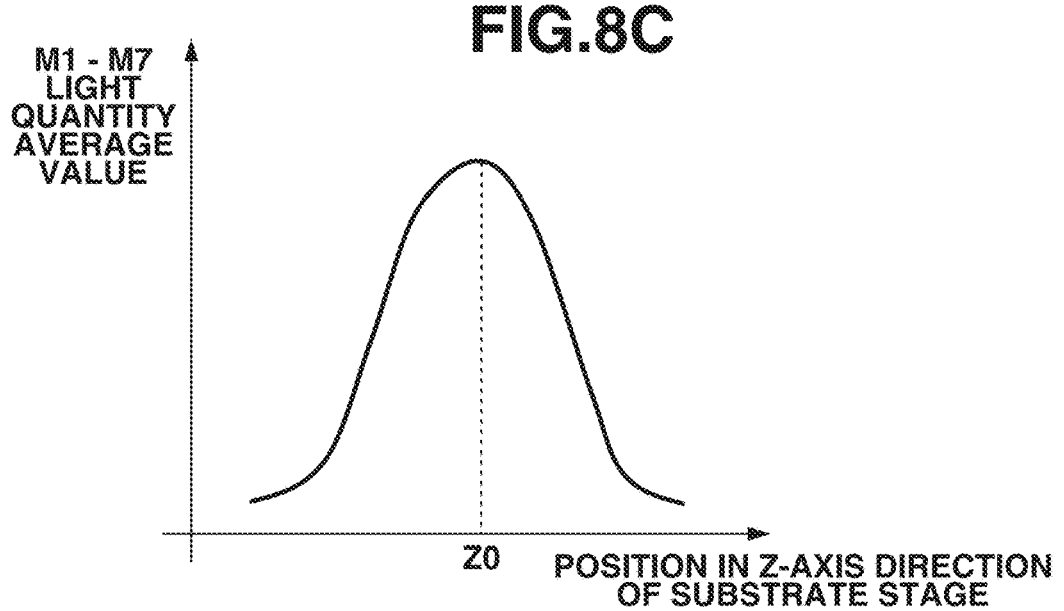

FIGS. 8A to 8C are graphs used to explain the second method of determining the best focus position. FIG. 8A illustrates a light quantity distribution (light quantity distribution of illumination light) obtained as a result of detecting the pattern image of the first measurement mark 115 by the detection unit 22 when the substrate stage 6 is positioned at a certain position in the Z-axis direction. FIG. 8B illustrates a light quantity distribution obtained as a result of detecting the pattern image of the first measurement mark 115 by the detection unit 22 when the substrate stage 6 is positioned at another position in the Z-axis direction that is different from the position in FIG. 8A. In FIGS. 8A and 8B, the light quantity is measured by the detection unit 22 at the position at which the field curvature becomes minute, and thus variations in the light quantity in the distributions M1 to M7 are smaller than those in FIGS. 7A and 7B.

In this case, when the patterns of the distributions M1 to M7 are focused, the light quantity detected by the detection unit 22 changes according to the position of the substrate stage 6 in the Z-axis direction. FIG. 8C is a graph illustrating a change in the light quantity detected by the detection unit 22 when the distributions M1 to M7 are paid attention to. The vertical axis in the graph represents the average value of the light quantities in the distributions M1 to M7 illustrated in FIGS. 8A and 8B, and the horizontal axis in the graph represents the position in the Z-axis direction on the substrate stage 6. As illustrated in FIG. 8C, the light quantity changes according to the position in the Z-axis direction on the substrate stage 6. Since the light quantity detected by the detection unit 22 becomes maximum at the best focus position of the substrate stage 6, the reference focus position can be determined by obtaining the position of the substrate stage 6 at which the light quantity indicates the local maximum value Z0 illustrated in FIG. 8C.

After the reference focus position is calculated by using the above-described method, the detection unit 22 is moved in the X-axis direction at the image height (e.g., in the vicinity of the point 211b illustrated in FIG. 3) at which the field curvature is sufficiently large, and the light quantity distribution corresponding to the first measurement mark 115 is obtained. Thus, the focus calibration can be performed.

Figure 9:
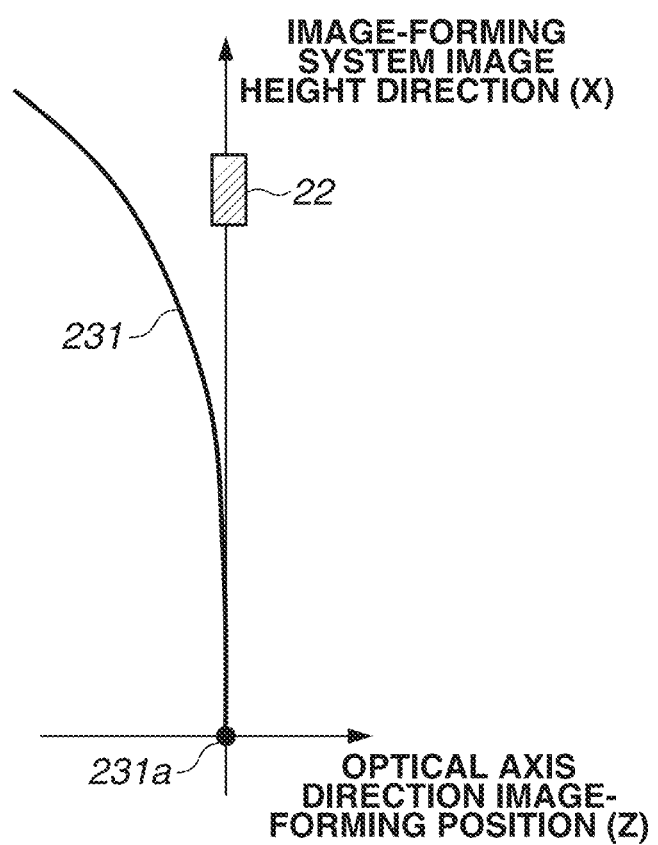
FIG. 9 is a longitudinal aberration diagram of a field curvature in a case where an envelope of a light quantity distribution has no local maximum value.

Depending on the shape of the field curvature, the envelope may have no extreme value in a case where the substrate stage 6 is moved in the X-direction from the mage height at which the field curvature is minute to the image height at which the field curvature is sufficiently large. FIG. 9 is a longitudinal aberration diagram illustrating the field curvature in a case where the envelope of the light quantity distribution detected by the detection unit 22 has no extreme value. The vertical axis in the graph of FIG. 9 represents the image height (X-coordinate) of the image-forming system, and the horizontal axis in the graph represents the image-forming position (Z-coordinate) in the optical axis direction. A curve 231 is a curve indicating the field curvature in the detection optical system 20 (i.e., a curve indicating the image-forming position at each image height).

In the curve 231, the light-receiving surface of the detection unit 22 and the image-forming position greatly deviate from a position in the vicinity of a point 231a. Accordingly, the distribution M1 may indicate the pattern in which the light quantity is maximum and the envelope may have no local maximum value. In this case, the substrate stage 6 is moved in the Z-axis direction so that the envelope has a local maximum value, and the focus value is managed on the premise that there is a difference corresponding to the amount of movement of the substrate stage 6 from the best focus, thus obtaining the amount of change in the best focus position.

As described above, an appropriate focus position is set to the reference focus position, thus eliminating the need to drive the substrate stage 6 that has been set at the measurement position in the Z-axis direction in the second and subsequent focus calibrations. Consequently, decrease in productivity due to the calibration can be prevented.

(Alignment Calibration)

Figure 10:
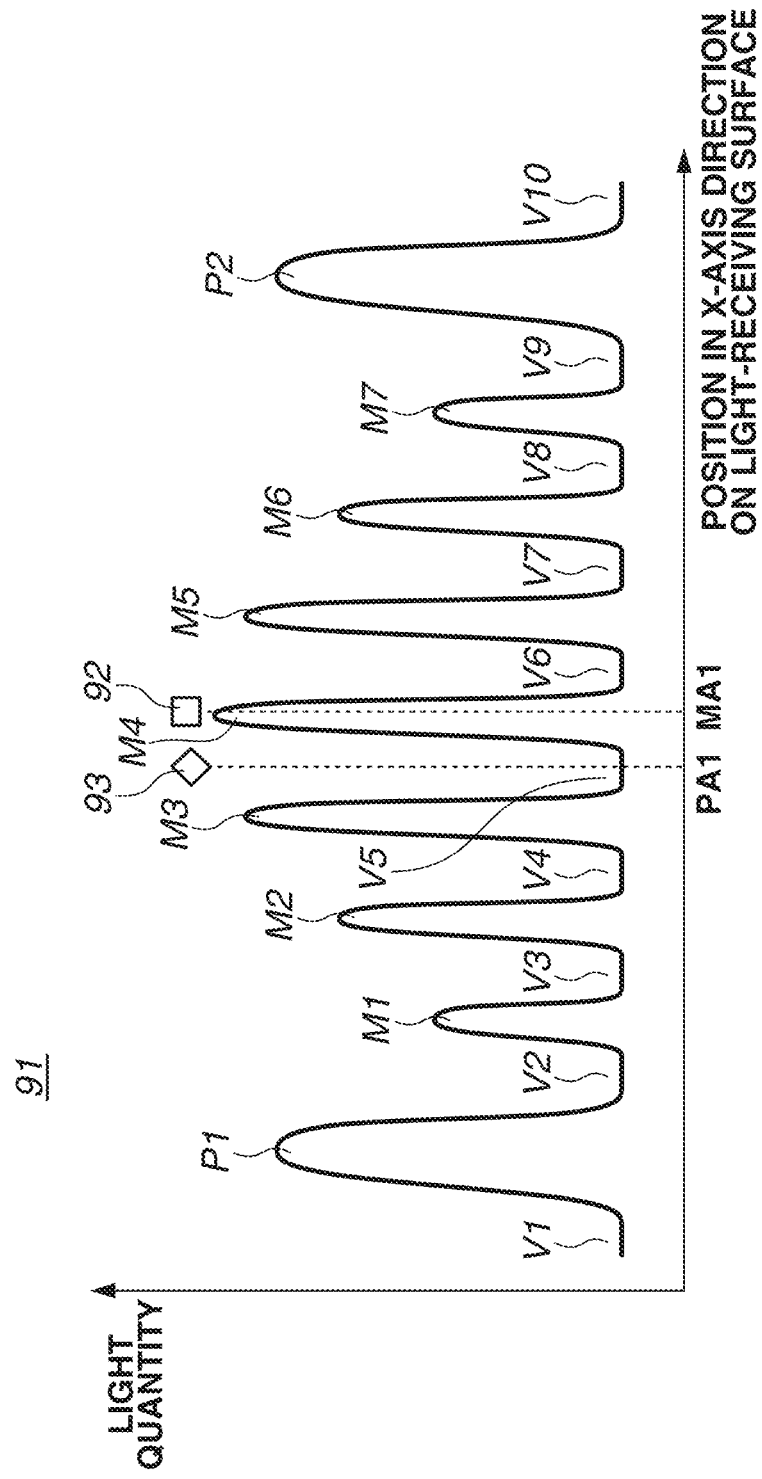
FIG. 10 is a graph illustrating a light quantity distribution at a reference alignment position.

Next, amount-of-change measurement processing of obtaining the amount of change in alignment according to the present exemplary embodiment will be described with reference to FIG. 10 and FIGS. 11A and 11B. FIGS. 10 and 11A are graphs each illustrating the light quantity distribution of illumination light that has passed through the first measurement mark 115 and the second measurement mark 109 and is detected by the detection unit 22 in the state of the exposure apparatus 100 illustrated in FIG. 4A. The vertical axis in the graph represents the light quantity obtained by the detection unit 22, and the horizontal axis in the graph represents the position in the X-axis direction on the light-receiving surface of the detection unit 22. The light quantity distribution illustrated in FIG. 10 includes the distributions M1 to M7 corresponding to the transmissive areas 115b of the first measurement mark 115, and the distributions P1 and P2 corresponding to the transmissive area 109b of the second measurement mark 109. The light quantity distribution also includes the distributions V1 to V10 corresponding to the light-shielded area 115a of the first measurement mark 115 and the distributions V1, V2, V9, and V10 corresponding to the light-shielded area 109a of the second measurement mark 109.

A method of determining an appropriate relative position (reference alignment position) between the mask 2 and the substrate stage 6 on the XY plane based on the light quantity distribution of illumination light illustrated in FIG. 10 will be described. Initially, the position on the light-receiving surface of the detection unit 22 in the respective patterns of the distributions M1 to M7 corresponding to the first measurement mark 115 is calculated (e.g., calculated by center-of-gravity calculation). A position 92 obtained by averaging the positions of the respective patterns is denoted by MA1. The position on the light-receiving surface of the detection unit 22 corresponding to the respective patterns of the distributions P1 and P2 is calculated (such a position is calculated by using, for example, center-of-gravity calculation). A position 93 obtained by averaging the positions of the respective patterns is represented by PA1. A difference between MA1 and PA1 represents a relative position of the first measurement mark 115 and the second measurement mark 109, i.e., a relative position of the mask 2 and the substrate stage 6.

FIG. 11A illustrates a state where the alignment position (relative position of the mask 2 and the substrate stage 6 in a direction parallel to the XY plane) has deviated from the state illustrated in FIG. 4A. Under the influence of heat or the like generated during the exposure processing, air fluctuations inside the projection optical system 4 and a positional deviation of a member of the projection optical system 4 may occur. Accordingly, the image of the first measurement mark 115 may deviate from the image-forming pattern 115P to an image-forming pattern 1150 in the X-axis direction as illustrated in FIGS. 4A and 11A. In this case, the light quantity distribution illustrated in FIG. 10 changes to the light quantity distribution illustrated in FIG. 11B.

In FIG. 11B, a position 95 obtained by averaging the positions of the distributions M1 to M7 is denoted by MA2 and a position 96 obtained by averaging the positions of the distributions P1 and P2 is denoted by PA2, as in FIG. 10. In this case, the position MA2 changes from the position MA1. The positions PA1 and PA2 correspond to the second measurement mark 109 that has passed through the projection optical system 4, and thus the positions PA1 and PA2 are not affected by air fluctuations inside the projection optical system 4 and a positional deviation of a member of the projection optical system 4. For this reason, the position of the transmissive area 109b of the second measurement mark 109 does not change due to the air fluctuations and the positional deviation of the member, and the distribution position PA2 corresponding to the transmissive area 109b does not change from the distribution position PA1. When a difference AA1 between MA1 and PA1 is set to a reference for alignment and a difference between MA2 and PA2 is denoted by AA2, the amount of change in the difference AA1 and the difference AA2 is calculated as the amount of change in alignment according to the present exemplary embodiment.

As described above, in the present exemplary embodiment, the amount of change in alignment can be calculated. In the present exemplary embodiment, the detection result from the detection unit 22 that is used in the focus calibration can also be used in the alignment calibration.

(Specific Method of Calibration Operation)

The methods of calculating the amount of change in focus and the amount of change in alignment have been described in detail above. Meanwhile, there is a possibility that the amount of change in focus and the amount of change in alignment cannot be accurately calculated without isolating the cause of a change in the graphs illustrated in FIGS. 4B, 5B, 10, and 11B to either one of the effects of the focus and the alignment of the projection optical system 4. A specific processing method of obtaining the amount of change in focus and the amount of change in alignment separately will be described below.

In the present exemplary embodiment, in a case where the position of the image plane on which the image of the first measurement mark 115 on the XY plane is formed changes due to the effects of air fluctuations inside the projection optical system 4 and the positional deviation of a member of the projection optical system 4, the measurement image height in the image-forming system 21 also changes. The image-forming system 21 according to the present exemplary embodiment has a field curvature, and thus the focus position of the image-forming system 21 also changes according to a change in the image height. Thus, the light quantity distribution indicating as if the focus also changed although only the image-forming position of the first measurement mark 115 on the XY plane has actually changed is obtained.

Thus, in order to isolate the amount of change that is affected when the state of the projection optical system 4 changes due to heat or the like (i.e., in order to calculate only the amount of change in focus), information about the amount of change in focus corresponding to the position on the light-receiving surface of the detection unit 22 is preliminarily held in the control unit 7. In addition to this, the amount of change in focus corresponding to the position on the light-receiving surface of the detection unit 22 is subtracted in the information indicating the characteristic focus change corresponding to the position on the light-receiving surface of the detection unit 22, thus making it possible to accurately measure the amount of change in focus in the projection optical system 4.

If the position of the image plane on which the image of the first measurement mark 115 on the XY plane is formed changes due to the effects of air fluctuations inside the projection optical system 4 and the positional deviation of a member of the projection optical system 4, the local maximum value of the envelope of the light quantity distribution detected on the light-receiving surface of the detection unit 22 also changes. In other words, the light quantity distribution indicating as if the position of the local maximum value of the envelope changed and the focus also changed although only the alignment position has actually changed is obtained.

Thus, in order to isolate the amount of change that is affected when the state of the projection optical system 4 changes due to heat or the like (or in order to calculate only the amount of change in alignment), a change amount MI1−ΔA and a change amount MI2−ΔB are calculated, where a difference between MA1 and PA1 is denoted by ΔA and a difference between MA2 and PA2 is denoted by ΔB. The amount of change in the alignment position is calculated by using a difference between MA1−PA1 and MA2−PA2, and the amount of change in the focus position is calculated by using a difference between MI1−ΔA and MI2−ΔB. Thus, a positional deviation in focus and a positional deviation in alignment can be accurately isolated.

Next, the amount of field curvature according to the present exemplary embodiment will be described with reference to FIGS. 12A and 12B.

In a case where the amount of field curvature in the range in which the light quantity distribution can be detected by the detection unit 22 is large, the light quantity distribution is steep with respect to a change in the image height (the light quantity rapidly changes). The amount of deviation in the envelope of the light quantity distribution when the focus has changed increases. On the other hand, when the amount of field curvature is small, features opposite to the above-described features are obtained.

Figure 12A:
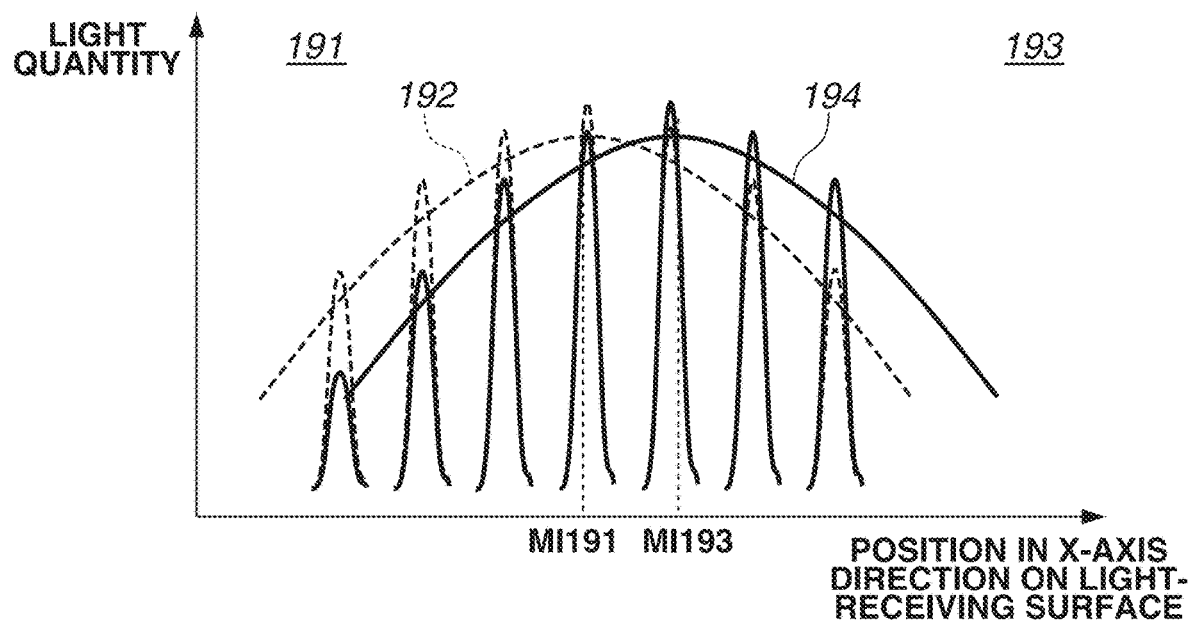
FIGS. 12A and 12B are graphs each illustrating a correspondence between a field curvature and a light quantity distribution.

FIG. 12A illustrates a light quantity distribution of illumination light when the amount of field curvature is large. A light quantity distribution 191 indicated by a broken line and a light quantity distribution 193 indicated by a solid line each indicate light quantity distributions at different focus positions. The center-of-gravity position of an envelope 192 in the light quantity distribution 191 indicated by the broken line is represented by MI191, and the center-of-gravity position of an envelope 194 in the light quantity distribution 193 indicated by the solid line is represented by MI193.

Figure 12B:
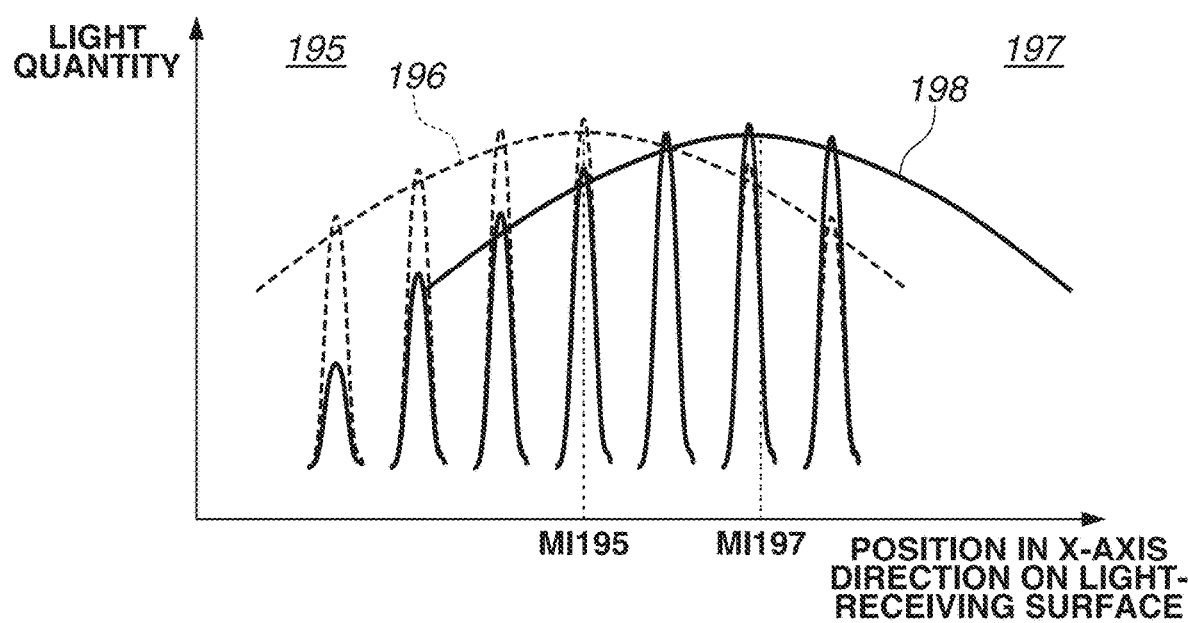

FIG. 12B illustrates a light quantity distribution of illumination light when the field curvature amount is smaller than that in FIG. 12A. A light quantity distribution 195 indicated by a broken line and a light quantity distribution 197 indicated by a solid line each indicate light quantity distributions at different focus positions. The center-of-gravity position of an envelope 196 in the light quantity distribution 195 indicated by the broken line is represented by MI195, and the center-of-gravity position of an envelope 198 in the light quantity distribution 197 indicated by the solid line is represented by MI197.

In the light quantity distributions illustrated in FIGS. 12A and 12B, only the amount of field curvature in the image-forming system 21 of the detection optical system 20 is different and the amount of focus in change indicated in the two light quantity distributions indicated by the solid line and the broken line, and the other conditions are the same.

In a case where FIGS. 12A and 12B are compared, the amounts of change in the center-of-gravity positions of two envelopes indicated by the solid line and the broken line are different. Specifically, in a case where the difference between the two center-of-gravity positions MI191 and MI193 illustrated in FIG. 12A is compared with the difference between the two center-of-gravity positions MI195 and MI197 illustrated in FIG. 12B, the difference between MI191 and MI193 illustrated in FIG. 12A in which the field curvature is large is smaller than the difference between MI195 and MI197 illustrated in FIG. 12B. Therefore, in a case where the field curvature is large, the amount of change in focus with an extreme value of the envelope decreases in the detection unit 22, and thus the measurement range can be increased by an amount corresponding to the decreased amount of change in focus. On the other hand, the sensitivity to the amount of change in focus decreases, which leads to decrease in measurement accuracy.

The above-described measurement range and measurement accuracy may be adjusted according to the required accuracy of a measurement system. Optical conditions (e.g., a designed wavelength, a numerical aperture, and a magnification) for the image-forming system 21, the line width and pitch of the line-and-space pattern of the first measurement mark 115, specifications (e.g., a Signal-to-Noise (S/N) ratio and a pixel size) of the detection unit 22, and the like have a trade-off relationship.

As a criterion for the amount of field curvature, an amount of field curvature with which a pattern intensity (e.g., the distributions M1 and M7 corresponding to the ends of FIG. 4B) becomes 0.2 or more at the same line width in the peripheral area may be set when the pattern intensity at the best focus (e.g., the distribution M4 illustrated in FIG. 4B) is one. This is because a sufficiently measurable contrast can be obtained at the pattern intensity of 0.2 or more.

Next, a specific exposure method will be described. As described above, the focus and alignment calibration operations can be executed based on the light quantity distribution detected by the detection unit 22. If a relative positional relationship between the mask 2 and the substrate stage 6 is recognized in advance, the relative position of the mask 2 and the substrate stage 6 can be controlled at a third timing after the second timing by using an alignment measurement system and a focus measurement system as described below. Specifically, the control unit 7 can expose the substrate 5 to light with the pattern of the mask 2, while appropriately managing the relative positional relationship between the mask 2 and the substrate 5.

Figure 13A:
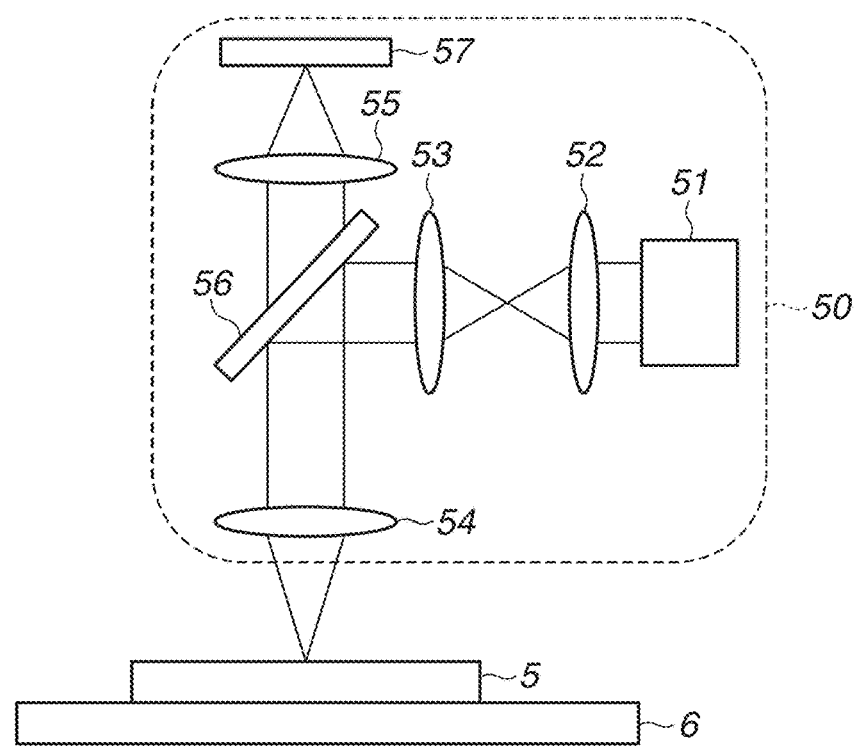
FIG. 13A illustrates a configuration of an alignment measurement system.
Figure 13B:
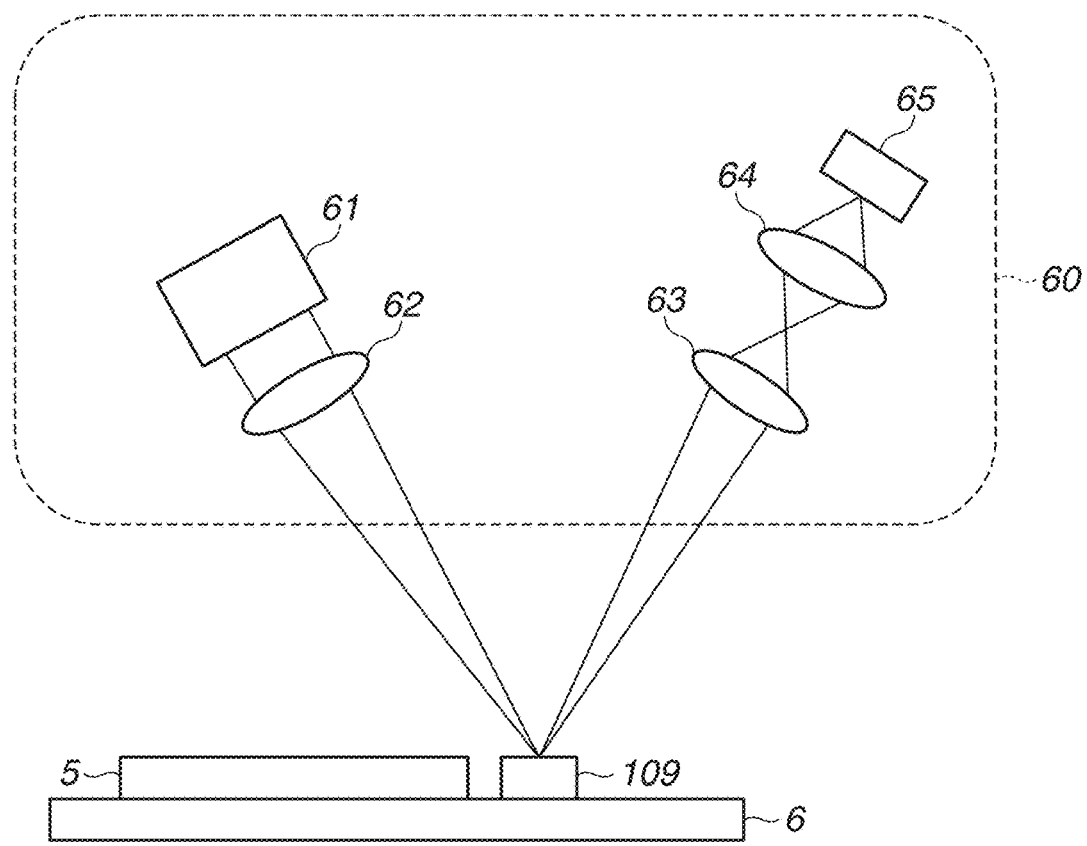
FIG. 13B illustrates a configuration of a focus measurement system.

FIG. 13A illustrates the alignment measurement system, and FIG. 13B illustrates the focus measurement system. An alignment measurement system 50 (also referred to as an off-axis alignment scope) illustrated in FIG. 13A includes a light source 51, such as a light-emitting diode (LED), lenses 52, 53, 54, and 55, a half mirror 56, and an image capturing unit 57. Light irradiated from the light source 51 passes through the lens 52 and the lens 53, and is reflected by the half mirror 56. The reflected light passes through the lens 54 and is perpendicularly incident on the substrate 5. The light incident on the substrate 5 is reflected and scattered by an alignment mark or the like on a shot area of the substrate 5, and the reflected and scattered light passes through the lens 54, the half mirror 56, and the lens 55, so that an image of the alignment mark is formed on the image capturing unit 57 and the alignment mark image is captured. The alignment measurement system 50 measures the position of the substrate 5 in the X-axis direction and the Y-axis direction that are parallel to the XY plane.

A focus measurement system 60 (also referred to as a surface position measurement system) illustrated in FIG. 13B includes a light source 61, such as an LED, lenses 62, 63, and 64, and an image capturing unit 65. Light irradiated from the light source 61 passes through the lens 62, and is obliquely incident on the substrate 5. The incident light is reflected on the substrate 5, passes through the lens 63 and the lens 64, and an image is captured by the image capturing unit 65. The focus measurement system 60 performs a position measurement in the Z-axis direction of the second measurement mark 109 formed on the substrate stage 6 and the substrate stage 6 (measurement of a surface height in the Z-axis direction). The positional relationship between the mask 2 and the substrate 5 can be recognized based on measurement results in the X-axis direction, the Y-axis direction, and the Z-axis direction and information about the focus and alignment calibrations described above.

The frequency of executing the calibrations described above may be appropriately set according to the stability of the projection optical system 4 and the accuracy required for the exposure apparatus 100. Since the calibrations according to the present exemplary embodiment can be executed without driving the substrate stage 6, adverse effects on the productivity are small even when the calibrations are executed frequently. Therefore, the relative position of the mask 2 and the substrate 5 can be accurately calibrated by increasing the frequency of executing the calibration.

Thus, in the amount-of-change measurement processing according to the present exemplary embodiment, there is no need to drive the substrate stage 6 in the Z-axis direction to obtain the amount of change in focus. Therefore, according to the present exemplary embodiment, in the calibration, the time required for the operation (focus calibration operation) for moving the substrate stage 6 in the Z-axis direction can be reduced, thus preventing decrease in the productivity of the exposure apparatus 100.

While the present exemplary embodiment illustrates an example where the substrate stage 6 is driven for the control unit 7 to control the relative position of the mask 2 and the substrate 5 at the third timing, the disclosure is not limited to this example. For example, the mask stage 3 may be driven, or both the mask stage 3 and the substrate stage 6 may be driven. In the present exemplary embodiment, a plurality of patterns (transmissive areas) of the first measurement mark 115 and the second measurement mark 109 is arranged side by side in the X-direction, but instead the first measurement mark 115 and the second measurement mark 109 in which a plurality of patterns similar to the above-described patterns is also arranged side by side in the Y-direction may be used. In such a case, a plurality of detection units 22 is prepared and provided as a first detection unit that detects images of the plurality of patterns arranged in the X-direction and as a second detection unit that detects images of the plurality of patterns arranged in the Y-direction.

A second exemplary embodiment of the disclosure will be described below. The first exemplary embodiment described above illustrates an example where the light quantity distribution of illumination light that has passed through the first measurement mark 115 and the second measurement mark 109 in which patterns are arranged in one direction (X-axis direction) is measured to execute calibration. The present exemplary embodiment illustrates an example where the light quantity distribution of illumination light that has passed through the first measurement mark 115 and the second measurement mark 109 in which patterns are arranged in a plurality of directions (X-axis direction and Y-axis direction) is measured to execute calibration. A basic configuration of the exposure apparatus 100 is similar to that of the first exemplary embodiment, and thus the description thereof is omitted. Matters that are not described in the second exemplary embodiment are similar to those described in the first exemplary embodiment.

Figure 14A:
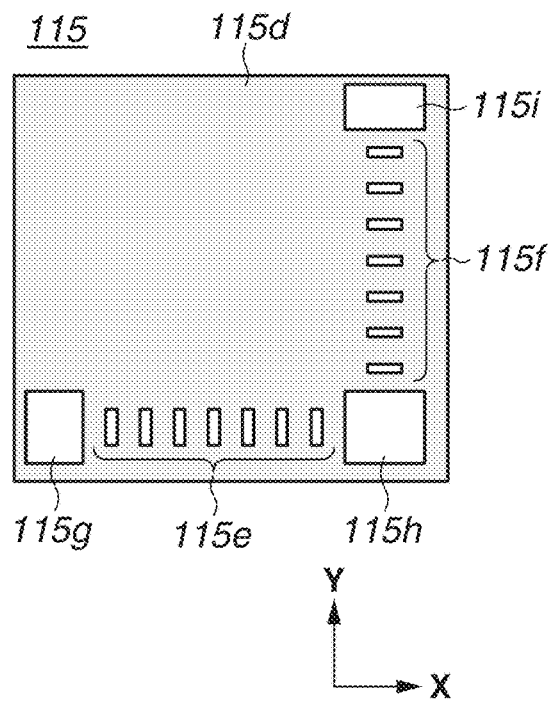
FIGS. 14A and 14B illustrate measurement marks according to a second exemplary embodiment.

FIG. 14A illustrates the first measurement mark 115 according to the present exemplary embodiment. The first measurement mark 115 according to the present exemplary embodiment includes a light-shielded area 115d, transmissive areas 115e and 115f, which are each a plurality of patterns with a predetermined line width and pitch, and transmissive areas 115g, 115h, and 115i. The transmissive areas 115e are arranged along the X-axis direction and form a line-and-space pattern. The transmissive areas 115f are arranged along the Y-axis direction and form a line-and-space pattern. While the present exemplary embodiment is described assuming that the first measurement mark 115 is formed on the mask 2, the disclosure is not limited to this example. The first measurement mark 115 may be provided at a position corresponding to an object surface of the projection optical system 4. For example, the first measurement mark 115 may be provided on the mask stage 3. In such a case, the calibration for the projection optical system 4 can be executed even in a case where the mask 2 is not placed on the mask stage 3.

As in the first exemplary embodiment, various patterns (or a pattern group) with different line widths, pitches, directions, and the like may be used as the line-and-space pattern of the transmissive areas 115e and 115f. The transmissive areas 115g, 115h, and 115i are provided to illuminate transmissive areas 109e, 109f, and 109g of the second measurement mark 109 to be described below.

Figure 14B:
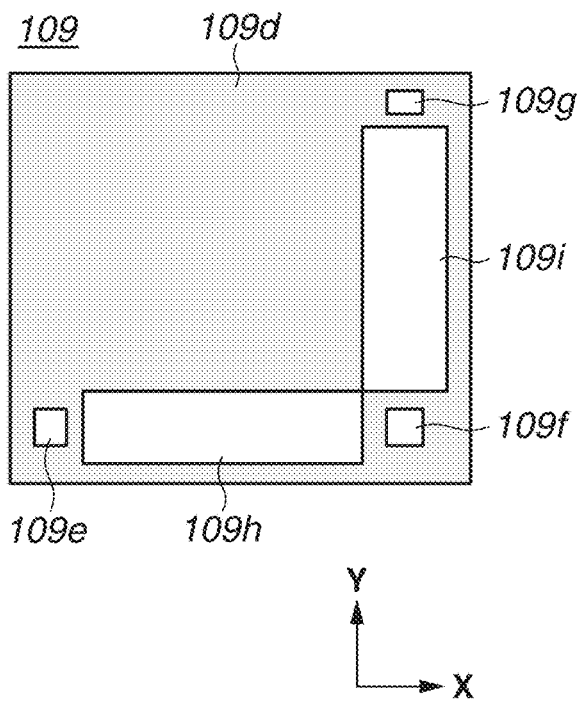

FIG. 14B illustrates the second measurement mark 109 according to the present exemplary embodiment. The second measurement mark 109 according to the present exemplary embodiment includes a light-shielded area 109d, the transmissive areas 109e, 109f, and 109g, and transmissive areas 109h and 109i. The transmissive areas 109e and 109f are formed as patterns in the X-axis direction, and the transmissive areas 109f and 109g are formed as patterns in the Y-axis direction.

While the present exemplary embodiment illustrates an example where the second measurement mark 109 is provided on the substrate stage 6, the disclosure is not limited to this example. The second measurement mark 109 is set at a position which corresponds to the image plane of the projection optical system 4 and at which the pattern of the first measurement mark 115 is projected. For example, the second measurement mark 109 may be provided in a unit or element that is different from the substrate stage 6.

The transmissive areas 109h and 109i are provided to transmit the pattern images formed on the transmissive areas 115e and 115f of the first measurement mark 115.

Figure 14C:
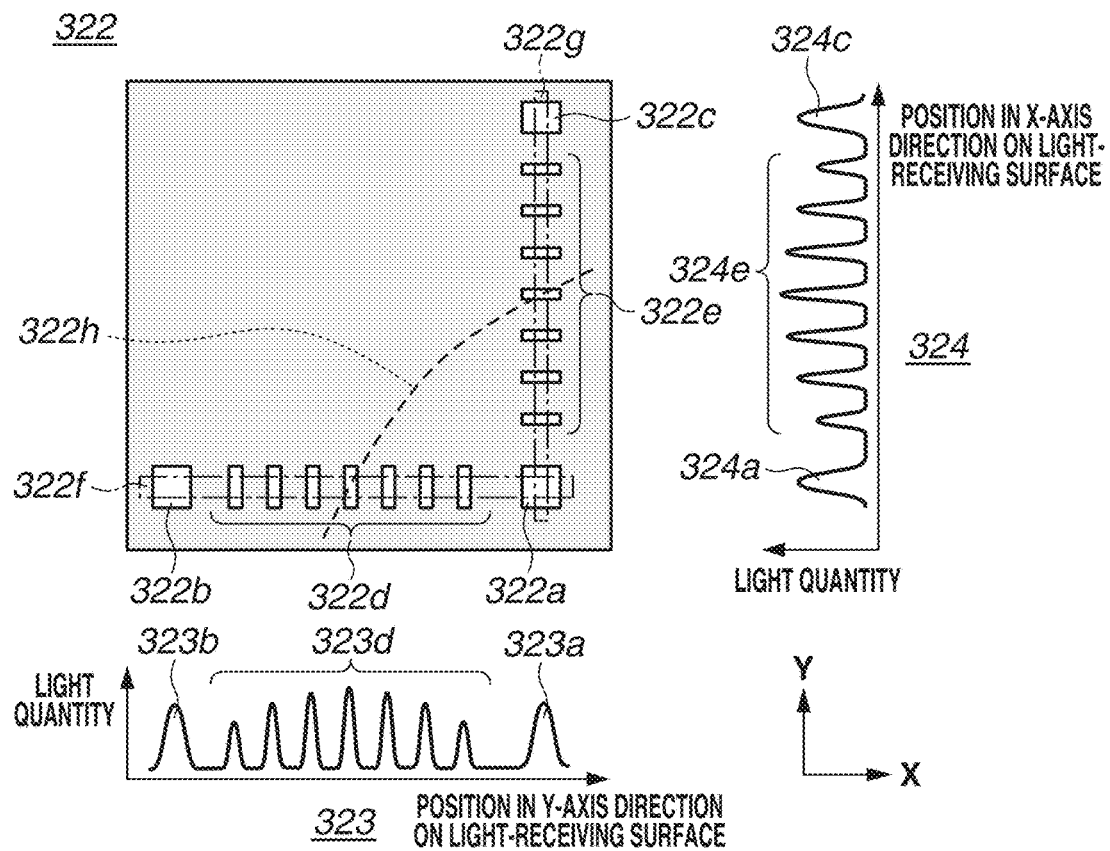
FIG. 14C illustrates a light quantity distribution detected by a detection unit.

FIG. 14C illustrates a light quantity distribution detected by the detection unit 22. An area 322 represents a state where the illumination light reaches the light-receiving surface of the detection unit 22. Areas 322a to 322e represent the pattern images.

A line intersection 322h represents a line where the light-receiving surface of the detection unit 22 matches the image-forming plane. The image-forming system 21 has a field curvature in each of the X-axis direction and the Y-axis direction. Thus, the light-receiving surface of the detection unit 22 is not an exact match for the image-forming plane, and only partially overlaps the image-forming plane in each of the X-axis direction and the Y-axis direction. Therefore, the line intersection 322h is formed.

A light quantity distribution 323 is a distribution of quantities of light received on the light-receiving surface of the detection unit 22 in an area 322f extending in the X-axis direction of the detection unit 22. As illustrated in FIG. 14C, the light quantity in the area 322a corresponds to a distribution 323a in the light quantity distribution 323, the light quantity in the area 322b corresponds to a distribution 323b in the light quantity distribution 323, and the light quantity in the area 322d corresponds to a distribution 323d in the light quantity distribution 323.

A light quantity distribution 324 is a distribution of quantities of illumination light received on the light-receiving surface of the detection unit 22 in an area 322g extending in the Y-axis direction of the detection unit 22. As illustrated in FIG. 14C, the light quantity in the area 322a corresponds to a distribution 324a in the light quantity distribution 324, the light quantity in the area 322c corresponds to a distribution 324c in the light quantity distribution 324, and the light quantity in the area 322e corresponds to a distribution 324e in the light quantity distribution 323.

In the present exemplary embodiment, the light quantity distribution of illumination light that has passed through the first measurement mark 115 and the second measurement mark 109 can be obtained in each of the X-axis direction and the Y-axis direction, and the alignment calibration in each of the X-axis direction and the Y-axis direction can be performed based on the light quantity distribution in each of the X-axis direction and the Y-axis direction. The focus calibration can also be performed in a manner similar to the first exemplary embodiment.

In the present exemplary embodiment, the two-dimensional detection unit 22, such as an area sensor, can be used and positions in the X-axis direction and the Y-axis direction can be measured by a single detection unit 22. Consequently, space saving and cost saving can be achieved, unlike in the case where the detection unit 22 are prepared in each of the X-axis direction and the Y-axis direction.

In the amount-of-change measurement processing according to the present exemplary embodiment, there is no need to drive the substrate stage 6 in the Z-axis direction to obtain the amount of change in focus as well. Therefore, according to the present exemplary embodiment, in the calibration, the time for the operation (focus calibration operation) for moving the substrate stage 6 in the Z-axis direction can be reduced, thus preventing decrease in the productivity of the exposure apparatus 100.

A third exemplary embodiment of the disclosure will be described below. The first exemplary embodiment described above illustrates an example where the first measurement mark 115 is formed on the mask 2, the second measurement mark 109 is formed on the substrate stage 6, and the detection unit 22 is disposed on the substrate stage 6. The present exemplary embodiment illustrates an example where the first measurement mark 115 is disposed at a location other than the mask 2, an example where the second measurement mark 109 is disposed at a location other than the substrate stage 6, and an example where the detection unit 22 is disposed at a location other than the substrate stage 6.

The third exemplary embodiment is similar to the first exemplary embodiment in that the first measurement mark 115 is disposed on the object surface of the projection optical system 4 and the second measurement mark 109 is disposed on the image plane of the projection optical system 4. A basic configuration of the exposure apparatus 100 is similar to that of the first exemplary embodiment, and thus the description thereof is omitted. Matters that are not described in the present exemplary embodiment are similar to those of the first exemplary embodiment.

While the first exemplary embodiment described above illustrates two methods of obtaining the best focus position, the present exemplary embodiment illustrates an example where no change is observed in the light quantity distribution obtained by the detection unit 22 even when the substrate stage 6 is driven in the Z-axis direction. Accordingly, it is difficult to determine the best focus position by the methods described in the first exemplary embodiment. To determine the best focus position according to the present exemplary embodiment, the best focus position is to be determined based on the light quantity distribution which is changed by the detection unit 22 being driven in the optical axis direction when the detection unit 22 is placed. Thus, the detection unit 22 is to include a mechanism for driving the detection unit 22 in the optical axis direction. Alternatively, the detection optical system 20 that is placed below the substrate stage 6 as in the first exemplary embodiment may be used in combination to determine the best focus position.

Figure 15A:
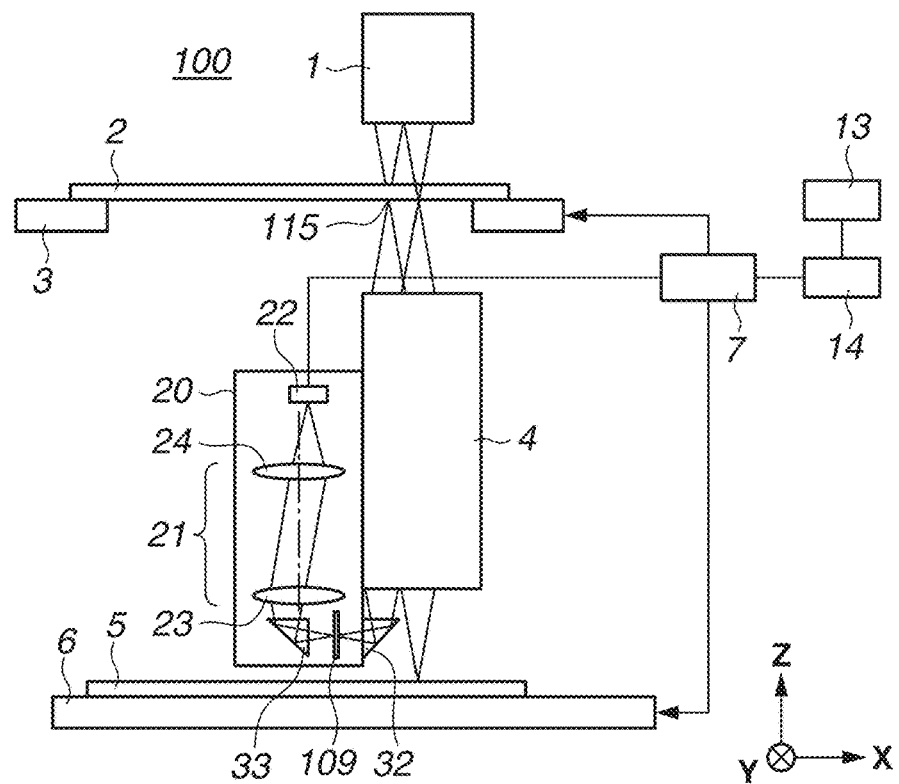
FIGS. 15A and 15B are schematic diagrams each illustrating a configuration of an exposure apparatus according to a third exemplary embodiment.

The exposure apparatus 100 according to the present exemplary embodiment will be described with reference to FIGS. 15A and 15B. FIG. 15A illustrates a state where the detection optical system 20 is fixed and disposed at a side portion (at a side surface of a lens barrel) of the projection optical system 4. As in the configuration illustrated in FIG. 1A, in the detection optical system 20, not only the image-forming system 21 which includes the system including the detection unit 22, the lens 23, and the lens 24, but also mirrors 32 and 33 for guiding illumination light to the image-forming system 21 are disposed. The second measurement mark 109 is not formed on the substrate stage 6, but is disposed at a position corresponding to the image plane of the projection optical system 4 between the mirror 32 and the mirror 33 in the optical system 20.

As described above in the first exemplary embodiment, the detection unit 22 can measure the amount of change in focus and the amount of change in alignment without driving the substrate stage 6. In the present exemplary embodiment, the detection optical system 20 including the detection unit 22 can measure the amount of change in focus and the amount of change in alignment in a state where the projection optical system 4 is fixed, without the need for moving the projection optical system 4 in the optical axis direction. By utilizing this feature, illumination light having an optical path that is slightly on the outside of illumination light (exposure light) to be irradiated on the substrate 5 during the exposure processing is guided to the detection unit 22 of the detection optical system 20, thus making it possible to constantly measure the amount of change in focus and the amount of change in alignment of the projection optical system 4 while performing the exposure processing. Thus, the calibration operation can be executed with no waiting time for measurements, thus reducing decrease in productivity.

Figure 15B:
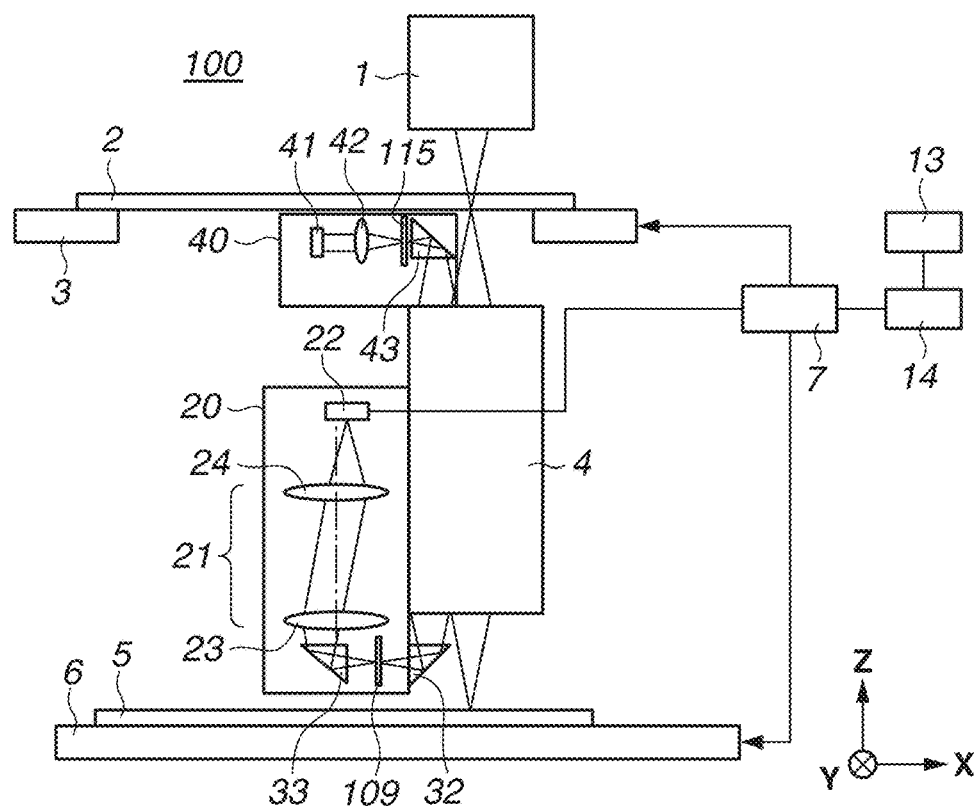

FIG. 15B illustrates a state where the first measurement mark 115 is not disposed on the mask 2 or the mask stage 3, but is disposed in an optical system 40 above the projection optical system 4. The optical system 40 includes elements, such as a light source 41, a lens 42, and a mirror 43, to illuminate the first measurement mark 115, and supplies illumination light different from the illumination light for the exposure processing.

The present exemplary embodiment is beneficial in that, for example, the calibration can be separately performed on each portion. For example, in contrast to the first exemplary embodiment, in the exposure apparatus 100 having a configuration illustrated in FIG. 15B, the image forming performance, deformation, and the like of only the projection optical system 4 can be recognized. Moreover, in contrast to the first exemplary embodiment, in the exposure apparatus 100 having a configuration illustrated in FIG. 15A, the driving performance, deformation, and the like of the substrate stage 6 can be recognized by evaluating the difference between measured values. Thus, the present exemplary embodiment is beneficial in that the performance in each portion can be separately recognized, as compared with in the first exemplary embodiment.

Moreover, in the amount-of-change measurement processing according to the present exemplary embodiment, the operation for driving the substrate stage 6 in the Z-axis direction is not required to obtain the amount of change in focus. The optical system 20 including the detection unit 22 is not moved in the optical axis direction, either. Therefore, according to the present exemplary embodiment, in the calibration, the time for the operation for moving the substrate stage 6 in the Z-axis direction (focus calibration operation) and the like can be reduced, thus preventing decrease in the productivity of the exposure apparatus 100.

<Exemplary Embodiment of Article Manufacturing Method>

An article manufacturing method according to an exemplary embodiment of the disclosure is suitably used to manufacture, for example, an FPD. The article manufacturing method according to the present exemplary embodiment includes a process (substrate exposure process) for forming a latent image pattern using the exposure apparatus 100 described above on a photosensitive agent coated on the substrate 5, and a process for developing the substrate 5 on which the latent image pattern is formed. The article manufacturing method further includes other known processes (such as oxidation, film formation, deposition, doping, planarization, etching, resist removing, dicing, bonding, and packaging). The article manufacturing method according to the present exemplary embodiment is beneficial in at least one of the article performance, quality, productivity, and production cost of an article as compared with the related art methods.

Exemplary embodiments of the disclosure have been described above. However, the disclosure is not limited to the above-described exemplary embodiments and can be modified or changed in various ways without departing from the gist of the disclosure.

According to an aspect of the disclosure, it is possible to provide an exposure apparatus beneficial in that decrease in productivity due to a calibration operation is reduced.

While the disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of Japanese Patent Application No. 2020-185158, filed Nov. 5, 2020, which is hereby incorporated by reference herein in its entirety.

What is claimed is:

1. An exposure apparatus comprising:
   a projection system configured to project a pattern of a mask on a substrate;
   a detection system including a detection unit configured to detect a light quantity distribution of illumination light having passed through a first mark, the projection system, and a second mark, the first mark being disposed on an object surface of the projection system, the second mark being disposed on an image plane of the projection system; and a control unit configured to control a relative position of the mask and the substrate, wherein the detection system detects a first light quantity distribution at a first timing, which is before an exposure process of exposing the pattern on the substrate and a second light quantity distribution at the second timing, which is after the exposure process, and wherein the control unit controls the relative position of the mask and the substrate in an optical axis direction of the projection system and the relative position of the mask and the substrate in a direction perpendicular to the optical axis direction based on the first light quantity distribution and the second light quantity distribution.

2. The exposure apparatus according to claim 1, wherein the control unit controls the relative position of the mask and the substrate based on a difference between a peak position of an envelope of the first light quantity distribution and a peak position of an envelope of the second light quantity distribution.

3. The exposure apparatus according to claim 1, wherein the second light quantity distribution is a light quantity distribution detected by the detection unit after the first light quantity distribution is detected by the detection unit and then the exposure apparatus performs exposure processing a predetermined number of times or for a predetermined period of time.

4. The exposure apparatus according to claim 1, wherein the relative position in the optical axis direction when the first light quantity distribution is detected by the detection unit is a best focus position of the projection system.

5. The exposure apparatus according to claim 4, wherein the control unit determines the best focus position based on a light quantity distribution detected by the detection system while being causing the second mark to move in the optical axis direction.

6. The exposure apparatus according to claim 1, wherein the first mark includes at least two marks.

7. The exposure apparatus according to claim 1, wherein the object surface is a surface on which the pattern of the mask is formed.

8. The exposure apparatus according to claim 1, wherein the first mark is formed on the mask.

9. The exposure apparatus according to claim 1, further comprising a mask stage that holds the mask, wherein the first mark is formed on the mask stage.

10. The exposure apparatus according to claim 1, wherein the first mark is disposed on a surface different from a surface on which the pattern of the mask is formed, and is illuminated with illumination light different from illumination light used for the exposure apparatus to perform exposure processing.

11. The exposure apparatus according to claim 1, wherein the image plane is a surface on the substrate when the substrate is disposed.

12. The exposure apparatus according to claim 1, further comprising a substrate stage that holds the substrate, Wherein the second mark is formed on the substrate stage.

13. The exposure apparatus according to claim 1, wherein the second mark is disposed on a surface different from an upper surface of a substrate stage that holds the substrate, and is illuminated with illumination light different from illumination light used for the exposure apparatus to perform exposure processing.

14. The exposure apparatus according to claim 1, wherein the control unit stores table data indicating a correspondence relationship between a light quantity distribution which is detected by the detection unit and the relative position of the mask and the substrate in the optical axis direction, and corrects the relative position of the mask and the substrate in the optical axis direction using the table data.

15. The exposure apparatus according to claim 1, wherein the detection system is disposed on a substrate stage that holds the substrate.

16. The exposure apparatus according to claim 1, wherein the detection system is disposed on the projection system.

17. The exposure apparatus according to claim 1, wherein the detection system is a system disposed such that an image-forming plane on which the illumination light is formed as an image is not an exact match for a light-receiving surface of the detection unit and partially overlaps the light-receiving surface.

18. The exposure apparatus according to claim 17, wherein the detection system is a system with a field curvature.

19. An exposure method of performing exposure processing to transfer a pattern of a mask onto a substrate, the exposure method comprising:

detecting a light quantity distribution of illumination light having passed through a first mark, a projection system and a second mark, the first mark being disposed on an object surface of the projection system, the second mark being disposed on an image plane of the projection system; and controlling a relative position of the mask and the substrate, wherein the detecting detects a first light quantity distribution at a first timing, which is before an exposure process of exposing the pattern on the substrate and a second light quantity distribution at the second timing, which is after the exposure process, and wherein, in the controlling, the relative position of the mask and the substrate in an optical axis direction of the projection system and the relative position of the mask and the substrate in a direction perpendicular to the optical axis direction are controlled based on the first light quantity distribution and the second light quantity distribution.

20. An article manufacturing method comprising:

exposing a substrate to light using an exposure apparatus according to claim 1;

developing the substrate exposed to light; and manufacturing an article using the developed substrate.

* * * * *